US012804954B2

(12) United States Patent
Tsai et al.

(10) Patent No.: US 12,804,954 B2
(45) Date of Patent: Nov. 17, 2026

(54) INTEGRATED CIRCUIT DEVICE USING OXIDE SEMICONDUCTOR WITH OXYGEN VACANCY STABILIZING MATERIAL

(71) Applicant: Taiwan Semiconductor Manufacturing Company, Ltd., Hsinchu (TW)

(72) Inventors: Wu-Wei Tsai, Taoyuan City (TW); Yan-Yi Chen, Taipei City (TW); Hai-Ching Chen, Hsinchu City (TW); Kuan-Chi Wang, Hsinchu (TW)

(73) Assignee: Taiwan Semiconductor Manufacutring Company, Ltd., Hsinchu (TW)

( * ) Notice: Subject to any disclaimer, the term of this patent is extended or adjusted under 35 U.S.C. 154(b) by 362 days.

(21) Appl. No.: 18/397,217

(22) Filed: Dec. 27, 2023

(65) Prior Publication Data

US 2025/0220974 A1 Jul. 3, 2025

(51) Int. Cl.
*H10D 30/67* (2025.01)
*H10D 99/00* (2025.01)

(52) U.S. Cl.
CPC ..... *H10D 30/6755* (2025.01); *H10D 30/6704* (2025.01); *H10D 30/6757* (2025.01); *H10D 99/00* (2025.01)

(58) Field of Classification Search
CPC ........... H10D 30/6757; H10D 30/6755; H10D 30/6704
See application file for complete search history.

(56) References Cited

U.S. PATENT DOCUMENTS

2010/0123136 A1* 5/2010 Lee .................... H10D 30/6755 257/E29.139
2010/0148169 A1* 6/2010 Kim ..................... H10D 86/441 257/E29.296
2018/0190683 A1 7/2018 Koo

FOREIGN PATENT DOCUMENTS

CN 111081773 A * 4/2020 ............ H10P 50/282

* cited by examiner

*Primary Examiner* — Evren Seven
(74) *Attorney, Agent, or Firm* — Eschweiler & Potashnik, LLC

(57) ABSTRACT

Some embodiments relate to an integrated circuit device including a semiconductor layer including a first material having a first Gibbs free energy and a second material having a second Gibbs free energy less than the first Gibbs free energy. The first material includes a p-type oxide semiconductor material. The integrated circuit device further includes a dielectric layer contacting a first surface of the semiconductor layer, a gate conductive structure contacting the dielectric layer opposite the semiconductor layer, and a first source-drain conductive structure and a second source-drain conductive structure electrically connected to the semiconductor layer.

20 Claims, 28 Drawing Sheets

INTEGRATED CIRCUIT DEVICE USING OXIDE SEMICONDUCTOR WITH OXYGEN VACANCY STABILIZING MATERIAL

BACKGROUND

Oxide-based semiconductors (e.g., both p-type and n-type oxide semiconductors) have been employed in a range of integrated circuit (IC) devices, particularly those that include thin-film transistor (TFT) circuitry. Among the more popular applications for TFT circuitry are optical devices (e.g., image sensors, display devices, and so on), due in part to the significant level of transparency often attributed to TFTs. That transparency is due in part to the thin layers of material used in TFTs, as well as the transparent nature of some oxide semiconductors used therein.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
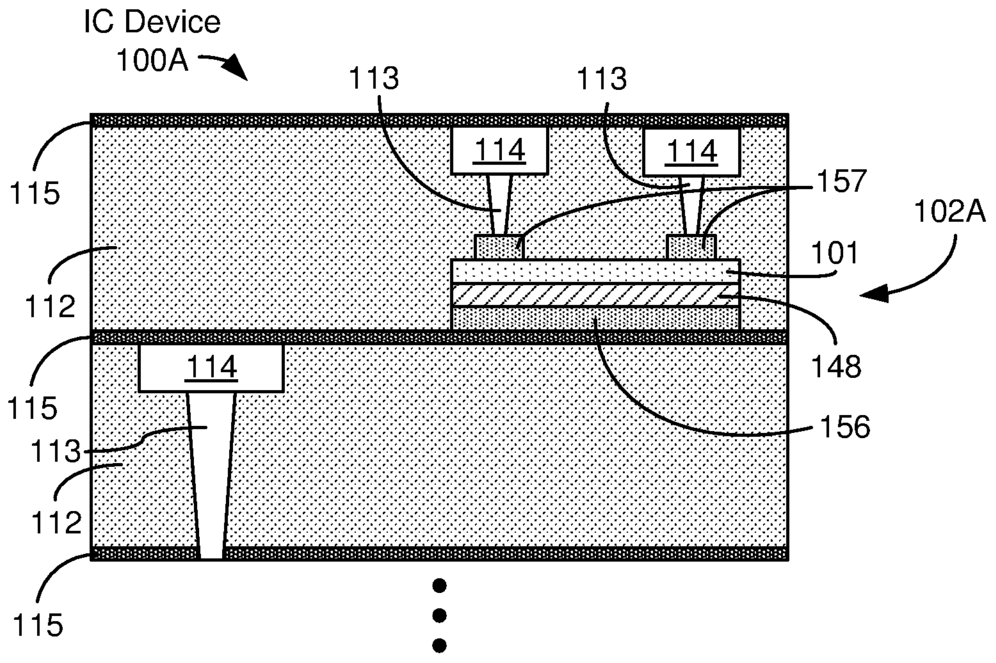
FIG. 1A illustrates a cross-sectional view of some embodiments of a back-end-of-line (BEOL) bottom-gate transistor of an IC device employing a stabilized p-type oxide semiconductor layer, according to the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In contrast to n-type oxide semiconductors, some p-type oxide semiconductors are viewed as electrically unstable due to chemical changes within the semiconductor (e.g., changes in the level of oxygen vacancies) that occur during processing steps of the IC device after the formation of the oxide semiconductor layer, as well as during operation of the completed IC device. More specifically, the changes in oxygen vacancies may cause associated fluctuations in the number of charge carriers available in the p-type oxide semiconductor, which may negatively impact the electrical performance of the transistors employing the p-type oxide semiconductor.

To address these issues, the present disclosure provides some embodiments of an IC device employing a stabilized p-type oxide semiconductor layer that includes an additional material that employs a lower Gibbs free energy (e.g., at a particular temperature and pressure) than that of the p-type oxide semiconductor material being used in the semiconductor layer. Generally, the Gibbs free energy is a thermodynamic potential that may be used to calculate a maximum amount of work, other than pressure-volume work, that may be performed by a thermodynamically closed system at constant temperature and pressure. That maximum amount of work, due to reversible processes, is calculated as a change in Gibbs free energy from an initial state to a final state of the system. Accordingly, the lower the change in Gibbs free energy, the less the amount of energy that is required for the change to occur. Further, a negative Gibbs free energy change, in which the final state possesses a lower Gibbs free energy than the initial state, may result in a corresponding spontaneous reaction in the system.

More formally, the Gibbs free energy of a system or material is expressed in the art as $G(p, T)=U+pV-TS=H-TS$, where p is pressure, T is temperature, U is internal energy, V is volume, H is enthalpy, and S is entropy of the system or material.

Thus, in some embodiments, the additional material, by virtue of its lower Gibbs free energy, may undergo oxygen vacancy creation and annihilation more readily than the p-type oxide semiconductor material in response to processing steps that transmit energy (e.g., thermal energy) to and from the IC device, thus stabilizing the level of oxygen vacancies in the p-type oxide semiconductor material.

Accordingly, use of some embodiments may provide transistors (e.g., TFTs) employing a p-type oxide semiconductor that facilitates an improved level of electrical performance (e.g., responsive and consistent transistor operation) by providing a stable number of charge carriers associated with oxygen vacancies in the p-type semiconductor region while providing the benefits (e.g., transparency) often associated with the use of an oxide semiconductor.

FIG. 1A illustrates a cross-sectional view of some embodiments of a back-end-of-line (BEOL) bottom-gate transistor 102A (e.g., a thin-film transistor (TFT)) of an IC device 100A employing a stabilized p-type oxide semiconductor layer 101, according to the present disclosure. Other portions of the IC device 100A (e.g., a front-end-of-line (FEOL) region, including a semiconductor substrate with doped regions for transistors) are not shown in FIG. 1A to simplify the following discussion.

Over an FEOL region of IC device 100A may be one or more dielectric layers 112, possibly separated by etch stop layers 115. Further, each of dielectric layers 112 may include conductive layers 114 and interconnecting contacts or vias 113 to provide electrical connectivity between various electronic components (e.g., BEOL transistors). As depicted in FIG. 1A, BEOL bottom-gate transistor 102A may be disposed within one of the dielectric layers 112. For example, a gate conductive layer 156 for the BEOL bottom-gate transistor 102A may be disposed over an etch stop layer 115. Over gate conductive layer 156 may be disposed a gate dielectric layer 148 (e.g., silicon dioxide ($SiO_2$), another silicon oxide ($SiO_x$), or another dielectric) for gate conductive layer 156 so that gate conductive layer 156 contacts gate dielectric layer 148.

Further, a semiconductor layer 101 (e.g., including a p-type oxide semiconductor according to embodiments of the present disclosure), as disclosed in greater detail below, is disposed over gate dielectric layer 148. Moreover, over semiconductor layer 101 is disposed first and second source-drain conductive structures 157 so that first and second source-drain conductive structures 157 contact semiconductor layer 101. In some embodiments, conductive layers 114 may be coupled by way of conductive vias 113 to source-drain conductive structures 157 to connect BEOL bottom-gate transistor 102A to other electronic components.

Figure 1B:
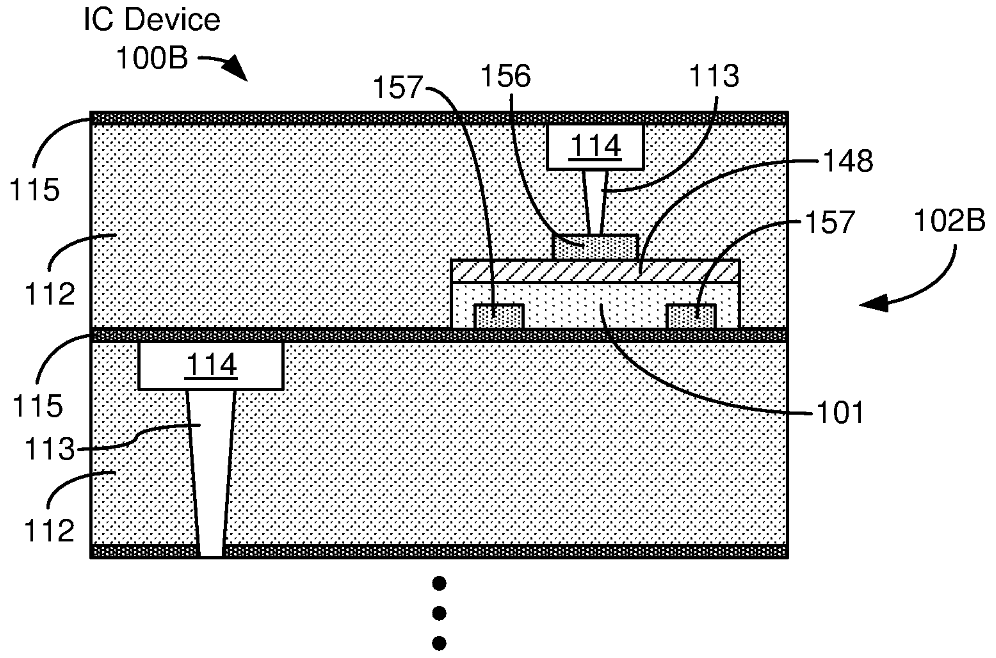
FIG. 1B illustrates a cross-sectional view of some embodiments of a BEOL top-gate transistor of an IC device employing a stabilized p-type oxide semiconductor layer, according to the present disclosure.

FIG. 1B illustrates a cross-sectional view of some embodiments of a BEOL top-gate transistor 102B of an IC device 100B employing a stabilized p-type oxide semiconductor layer 101, according to the present disclosure. As illustrated in FIG. 1B, BEOL top-gate transistor 102B may be disposed in a position similar to that of BEOL bottom-gate transistor 102A of FIG. 1A (e.g., within a dielectric layer 112).

More specifically, in the BEOL region, first and second source-drain conductive structures 157 may be disposed (e.g., over an etch stop layer 115). In turn, stabilized p-type oxide semiconductor layer 101 may be disposed over first and second source-drain conductive structures 157 and etch stop layer 115 so that first and second source-drain conductive structures 157 contact stabilized p-type oxide semiconductor layer 101. A gate dielectric layer 148 may be formed over stabilized p-type oxide semiconductor layer 101. Additionally, a gate conductive layer 156 may be disposed over gate dielectric layer 148 to contact gate dielectric layer 148. In addition, a conductive layer 114 may be electrically connected with gate conductive layer 156 by way of conductive vias 113 to connect BEOL top-gate transistor 102B to other electronic components.

In addition to BEOL bottom-gate transistor 102A of FIG. 1A and BEOL top-gate transistor 102B to FIG. 1B, a front-end-of-line (FEOL) transistor may also incorporate stabilized p-type oxide semiconductor layer 101. For example, FIG. 1C illustrates a cross-sectional view of some embodiments of an FEOL transistor 102C of an IC device 100C employing stabilized p-type oxide semiconductor layer 101, according to the present disclosure.

Figure 1C:
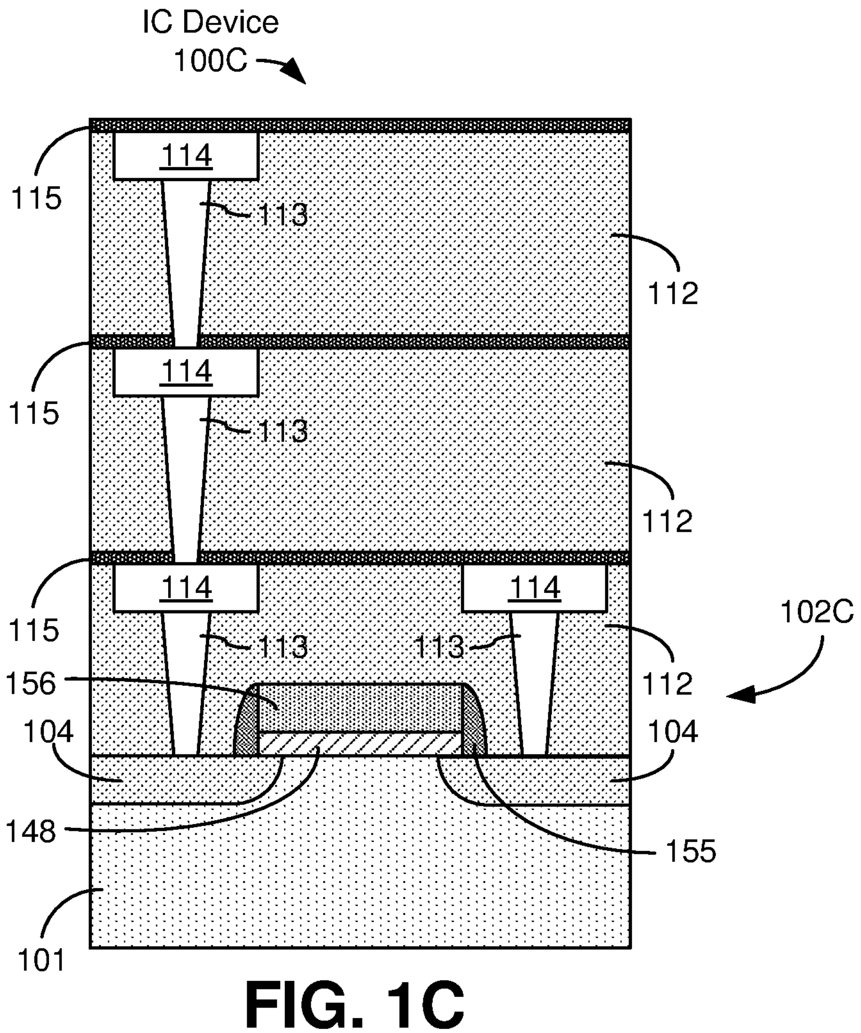
FIG. 1C illustrates a cross-sectional view of some embodiments of a front-end-of-line (FEOL) transistor of an IC device employing a stabilized p-type oxide semiconductor layer, according to the present disclosure.

More specifically, as illustrated in FIG. 1C, an FEOL region may employ stabilized p-type oxide semiconductor layer 101 as a substrate upon which one or more dielectric layers 112 may be disposed, possibly interleaved with etch stop layers 115. In some embodiments, p-type oxide semiconductor layer 101 may include n-doped source-drain regions 104. Over p-type oxide semiconductor layer 101 (e.g., within a first dielectric layer 112) may be disposed a gate dielectric layer 148, followed by a gate conductive layer 156. In some embodiments, a spacer structure 155 may laterally surround gate dielectric layer 148 and gate conductive layer 156. In addition, in some embodiments, conductive layers 114 may be electrically connected to source-drain regions 104 by way of conductive vias 113, thus facilitating connection of FEOL transistor 102C to other electronic components, such as other transistors.

In each of BEOL bottom-gate transistor 102A, BEOL top-gate transistor 102B, and FEOL transistor 102C, the inclusion of stabilized p-type oxide semiconductor layer 101 may facilitate enhanced operational performance compared to transistors employing other p-type oxide semiconductor layers while taking advantage of the other properties associated with p-type oxide semiconductor layers, such as a significant level of transparency. To focus the following discussion, various embodiments of stabilized p-type oxide semiconductor layer 101 are discussed below within the environment of a BEOL back-gate transistor. However, use of these embodiments is not limited to use within a BEOL back-gate transistor, as described above.

FIGS. 2A through 2F, FIGS. 3A through 3F, FIGS. 4A through 4F, FIGS. 5A through 5H, FIGS. 6A through 6H, FIGS. 7A through 7H, FIGS. 8A through 8H, FIGS. 9A through 9J, and FIGS. 10A through 10F illustrate cross-sectional views of some embodiments of IC devices, each employing a corresponding stabilized p-type oxide semiconductor layer within a BEOL back-gate transistor (e.g., a TFT), at various stages of manufacture, according to the present disclosure. Although each of FIGS. 2A through 2F, FIGS. 3A through 3F, FIGS. 4A through 4F, FIGS. 5A through 5H, FIGS. 6A through 6H, FIGS. 7A through 7H, FIGS. 8A through 8H, FIGS. 9A through 9J, and FIGS. 10A through 10F are described as separate series of acts, it will be appreciated that these acts are not limiting in that the order of the acts within each series can be altered in other embodiments, and the methods disclosed are also applicable to other structures. In other embodiments, some acts that are illustrated and/or described may be omitted in whole or in part.

Figure 2A:
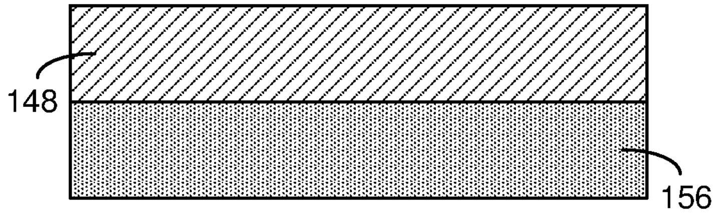
FIGS. 2A through 2F, FIGS. 3A through 3F, FIGS. 4A through 4F, FIGS. 5A through 5H, FIGS. 6A through 6H, FIGS. 7A through 7H, FIGS. 8A through 8H, FIGS. 9A through 9J, and FIGS. 10A through 10F illustrate cross-sectional side views of some embodiments of IC devices, each employing a corresponding stabilized p-type oxide semiconductor layer, at various stages of manufacture, according to the present disclosure.

For example, FIGS. 2A through 2F illustrate cross-sectional views of some embodiments of a BEOL back-gate transistor that includes a p-type oxide semiconductor layer 101A, at various stages of manufacture, according to the present disclosure. For example, FIG. 2A illustrates the forming (e.g., deposition) of a gate dielectric layer 148 over a gate conductive layer 156. In some embodiments, gate conductive layer 156 may include at least one of titanium nitride (TiN), hydrogen-rich TiN, tungsten (W), copper (Cu), molybdenum (Mo), molybdenum tungsten (MoW), tantalum nitride (TaN), or another conductive material. Gate dielectric layer 148 may include at least one of silicon dioxide ($SiO_2$), aluminum oxide ($Al_2O_3$), hafnium oxide (HfO), HfO mixed with zirconium oxide (ZrO) (HfO:ZrO), HfO mixed with $Al_2O_3$(HfO:$Al_2O_3$), HfO mixed with lanthanum(III) oxide ($La_2O_3$) (HfO:$La_2O_3$), HfO mixed with $SiO_2$ (HfO:$SiO_2$), HfO mixed with strontium oxide (SrO) (HfO:SrO), or another dielectric material.

Figure 2B:
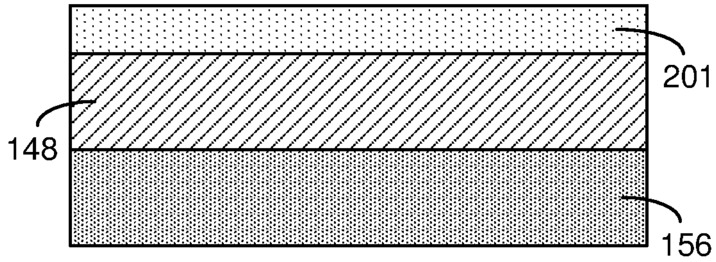
Figure 2C:
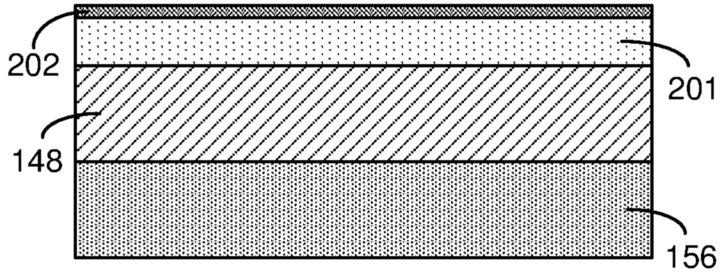
Figure 2D:
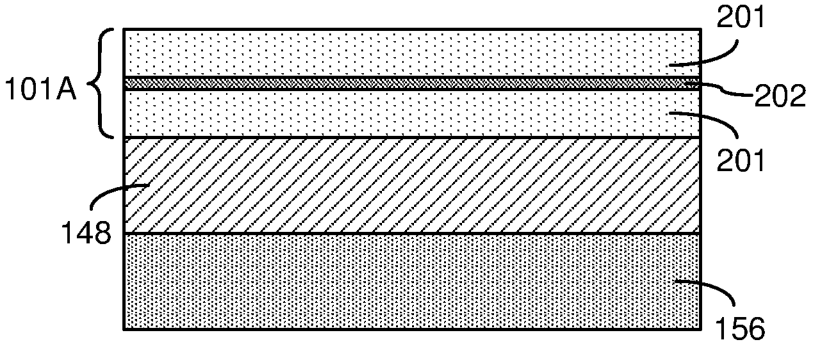

FIGS. 2B through 2D illustrate the forming (e.g., deposition) of p-type oxide semiconductor layer 101A over gate dielectric layer 148. More specifically, FIG. 2B illustrates a first layer of a first material 201 that includes a p-type oxide semiconductor material. In some embodiments, the p-type oxide semiconductor material may include at least one of copper oxide ($CuO_x$), tin oxide ($SnO_x$), titanium oxide ($TiO_x$), or another oxide semiconductor material. Further, in some embodiments, the first layer of first material 201, as well as other layers of first material 201 described herein, may be from several nanometers to tens of nanometers thick. For example, in some embodiments, the first layer of first material 201, as well as other layers of first material 201 described herein, may be at least three nanometers (nm) thick, while in other embodiments, may be at least 20 nm thick. Also, in some embodiments, the first layer of first material 201, as well as other layers of first material 201 described herein, may be no more than 50 nm thick, while in other embodiments, may be no more than 100 nm thick.

FIG. 2C illustrates the forming (e.g., deposition) of a layer of a second material 202 on the first layer of first material 201. In some embodiments, second material 202, may possess a Gibbs free energy that is less than a Gibbs free energy of first material 201. In some embodiments, second material 202 may include at least one of gallium nitride (GaN), aluminum oxide ($AlO_x$), tantalum oxide ($TaO_x$), yttrium oxide ($YO_x$), scandium oxide ($ScO_x$), niobium oxide ($NbO_x$), or another metal nitride or metal oxide with a lower Gibbs free energy than a Gibbs free energy of first material 201.

In some embodiments, the layer of second material 202, as well as other layers of second material 202, may be several angstroms (Å) thick. For example, the layer of second material 202, as well as other layers of second material 202, may be at least five Å thick, while in other embodiments, may be at least 20 Å thick. Also, in some embodiments, the layer of second material 202 may be less than or equal to 50 Å thick. The thickness of second material 202 may be of a minimum thickness that, based on the particular first material 201 and second material 202, is sufficient to stabilize the level of oxygen vacancies in first material 201.

FIG. 2D illustrates the forming (e.g., deposition) of a second layer of first material 201 on the layer of second material 202. In some embodiments, the second layer of first material 201 may be of equal thickness to that of the first layer of first material 201, and thus may be from several nanometers to tens of nanometers thick.

Figure 2E:
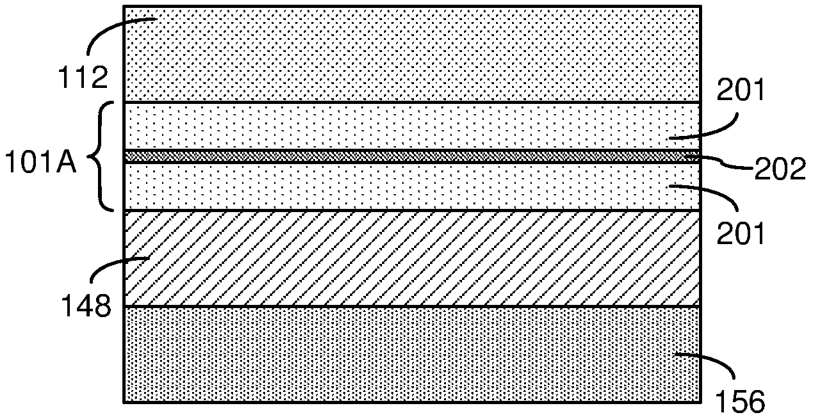

FIG. 2E illustrates the forming (e.g., deposition) of an upper dielectric layer 112 over p-type oxide semiconductor layer 101A. In some embodiments, upper dielectric layer 112 may include at least one of $SiO_x$, silicon nitride ($SiN_x$), or another dielectric material.

Figure 2F:
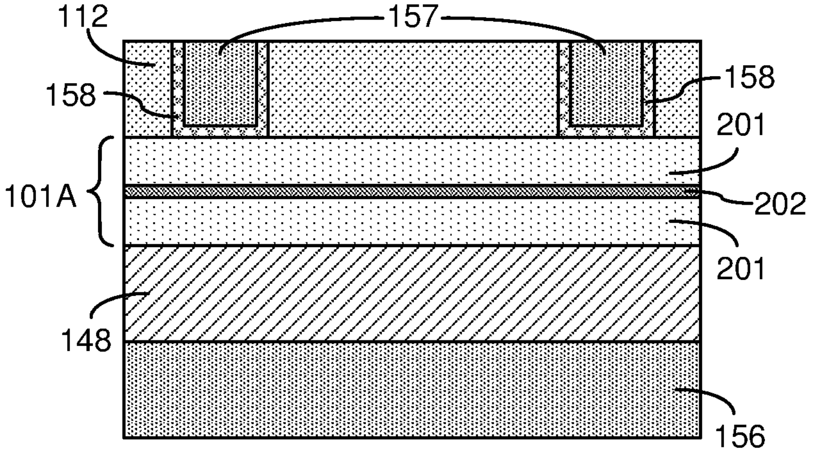

FIG. 2F illustrates the forming of first and second source-drain conductive structures 157 in upper dielectric layer 112 such that first and second source-drain conductive structures 157 are electrically connected to p-type oxide semiconductor layer 101A. In some embodiments, upper dielectric layer 112 is etched to expose an upper surface of p-type oxide semiconductor layer 101A, and conductive material is deposited in the etched portions to form first and second source-drain conductive structures 157. In some embodiments, an intermediate conductive layer 158 may be conformally deposited in the etched portions prior to deposition of source-drain conductive structures 157 (e.g., to provide a diffusion barrier between first and second source-drain conductive structures 157 and the surrounding regions of upper dielectric layer 112 and the upper surface of p-type oxide semiconductor layer 101A).

Accordingly, in p-type oxide semiconductor layer 101A of the resulting transistor structure, in some embodiments, a relatively small amount of second material 202 added to first material 201 may stabilize the level of oxygen vacancies in first material 201 as a result of the lower Gibbs free energy of second material 202 relative to that of first material 201. For example, second material 202 may undergo oxygen vacancy creation and annihilation more readily than first material 201 in response to processing steps that transmit energy (e.g., thermal energy) to and from the IC device, which may stabilize the level of oxygen vacancies in first material 201, thus providing an improved level of electrical performance for the transistor structure over p-type oxide semiconductors that do not include second material 202.

Figure 3A:
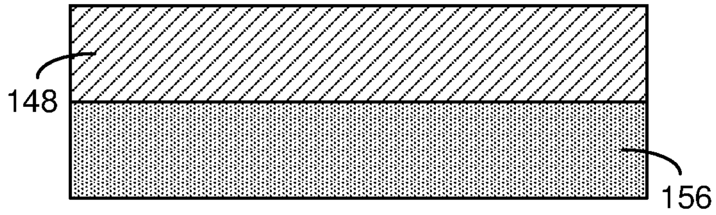
Figure 3B:
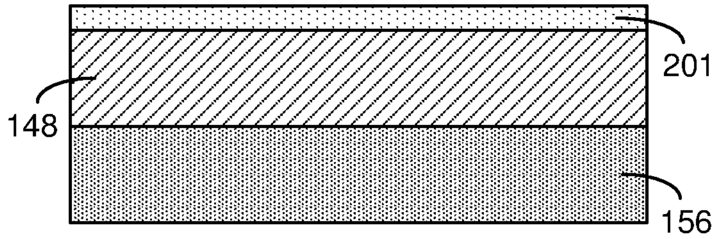
Figure 3C:
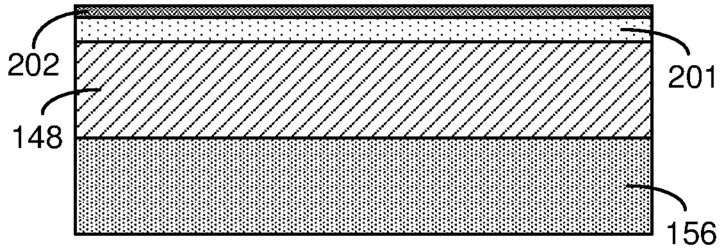
Figure 3D:
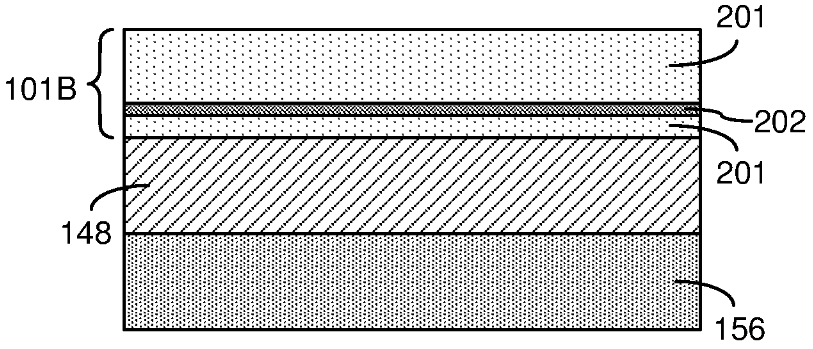
Figure 3E:
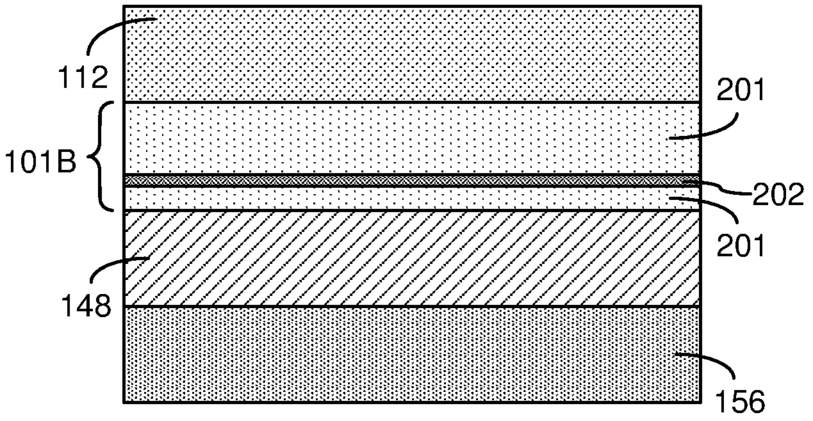
Figure 3F:
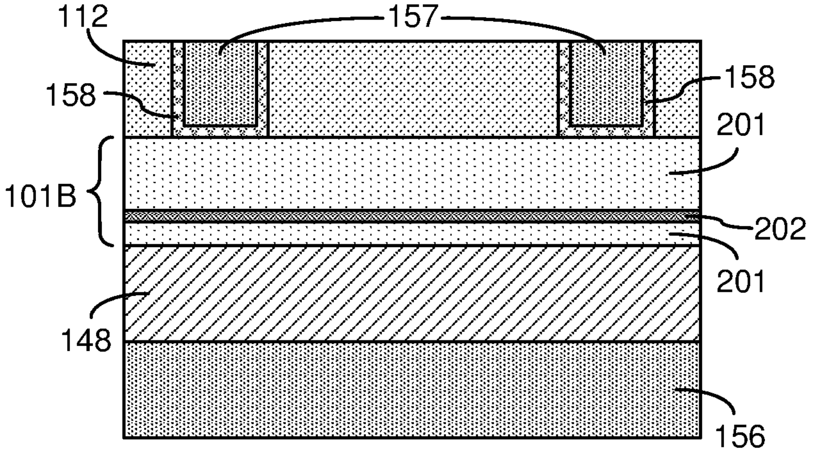

FIGS. 3A through 3F illustrate cross-sectional views of some embodiments of a BEOL back-gate transistor that includes a p-type oxide semiconductor layer 101B, at various stages of manufacture, according to the present disclosure. In some embodiments, the stages depicted in FIGS. 3A, 3E, and 3F are the same as, or similar to, those of FIGS. 2A, 2E, and 2F, respectively, as described above. FIGS. 3B through 3D illustrate the forming (e.g., deposition) of p-type oxide semiconductor layer 101B over gate dielectric layer 148. More specifically, FIG. 3B illustrates a first layer of first material 201 that includes a p-type oxide semiconductor material. In some embodiments, the p-type oxide semiconductor material may include one or more of those materials listed above in conjunction with FIG. 2B, and may have a same thickness as described above.

FIG. 3C illustrates the forming (e.g., deposition) of a layer of a second material 202 on the first layer of first material 201. In some embodiments, second material 202 may possess a Gibbs free energy that is less than a Gibbs free energy of first material 201, as described above. In some embodiments, second material 202 may include at least one of the same materials discussed above in connection with FIG. 2C, and may have a same thickness as described above.

FIG. 3D illustrates the forming (e.g., deposition) of a second layer of first material 201 on the layer of second material 202. In some embodiments, the second layer of first material 201 may be thicker than the first layer of first material 201. For example, in some embodiments, the second layer of first material 201 may be at least three times thicker than the first layer of first material 201. In other embodiments, the second layer of first material 201 may be at least ten times thicker than the first layer of first material 201. In some embodiments, the second layer of first material 201 may be made thicker than the first layer of first material 201 to compensate for a higher expected rate of oxygen vacancy instability in a lower region of p-type oxide semiconductor layer 101B.

Figure 4A:
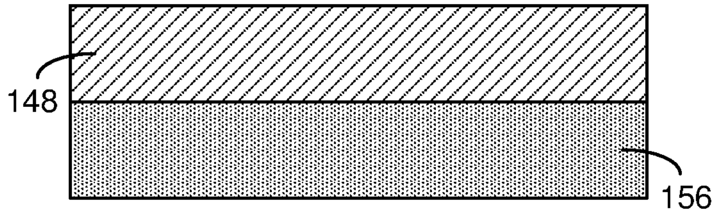
Figure 4B:
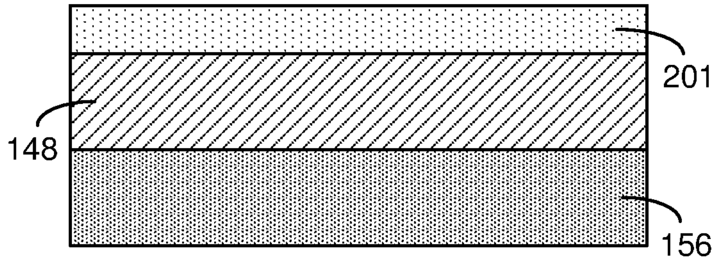
Figure 4C:
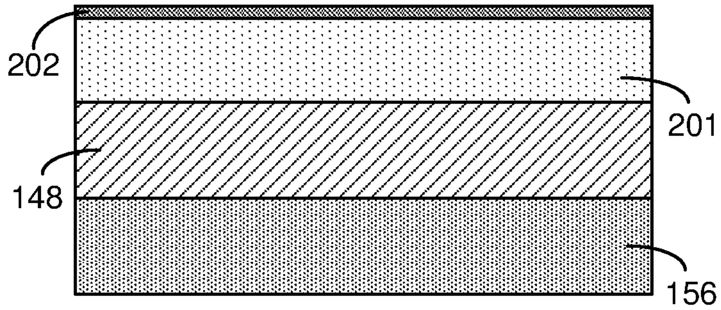
Figure 4D:
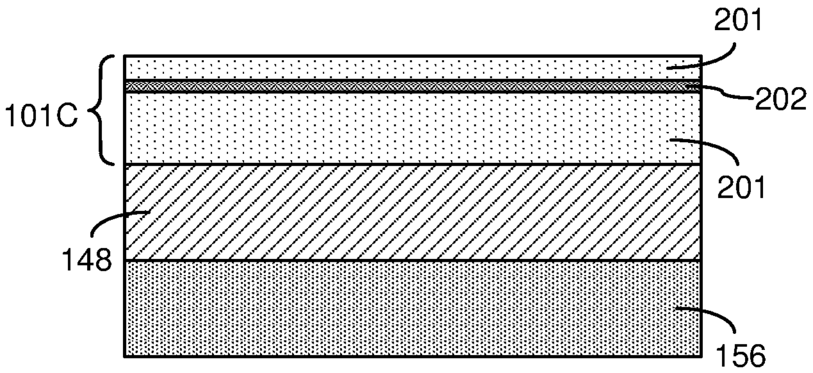
Figure 4E:
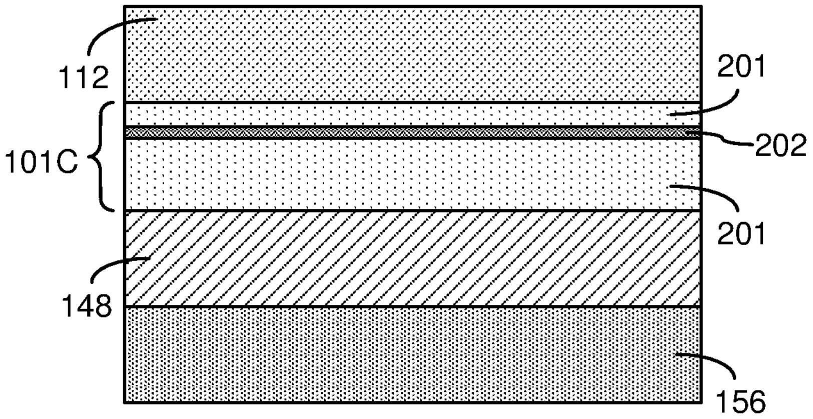
Figure 4F:
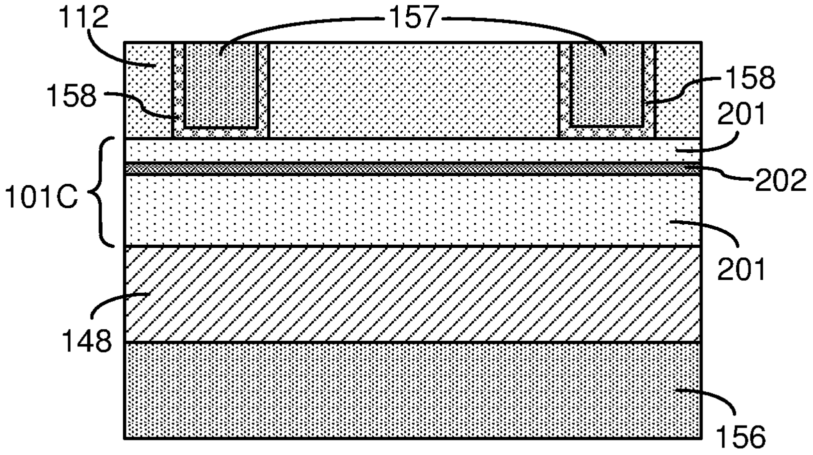

FIGS. 4A through 4F illustrate cross-sectional views of some embodiments of a BEOL back-gate transistor that includes a p-type oxide semiconductor layer 101C, at various stages of manufacture, according to the present disclosure. In some embodiments, the stages depicted in FIGS. 4A, 4E, and 4F are the same as, or similar to, those of FIGS. 2A, 2E, and 2F, respectively, as described above. FIGS. 4B through 4D illustrate the forming (e.g., deposition) of p-type oxide semiconductor layer 101C over gate dielectric layer 148. More specifically, FIG. 4B illustrates a first layer of first material 201 that includes a p-type oxide semiconductor material. In some embodiments, the p-type oxide semiconductor material may include at least one of those materials listed above in conjunction with FIG. 2B, and may have a same thickness as described above.

FIG. 4C illustrates the forming (e.g., deposition) of a layer of a second material 202 on the first layer of first material 201. In some embodiments, second material 202 may possess a Gibbs free energy that is less than a Gibbs free energy of first material 201, as described above. In some embodiments, second material 202 may include at least one of the same materials discussed above in connection with FIG. 2C, and may have a same thickness as described above.

FIG. 4D illustrates the forming (e.g., deposition) of a second layer of first material 201 on the layer of second material 202. In some embodiments, the first layer of first material 201 may be thicker than that of the second layer of first material 201. For example, in some embodiments, the first layer of first material 201 may be at least three times thicker than the second layer of first material 201. In other embodiments, the first layer of first material 201 may be at least ten times thicker than the second layer of first material 201. In some embodiments, the first layer of first material 201 may be made thicker than the second layer of first material 201 to compensate for a higher expected rate of oxygen vacancy instability in an upper region of p-type oxide semiconductor layer 101C.

Figure 5A:
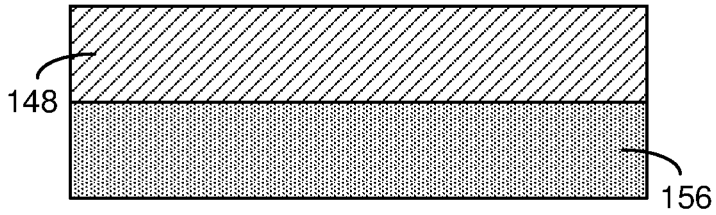
Figure 5B:
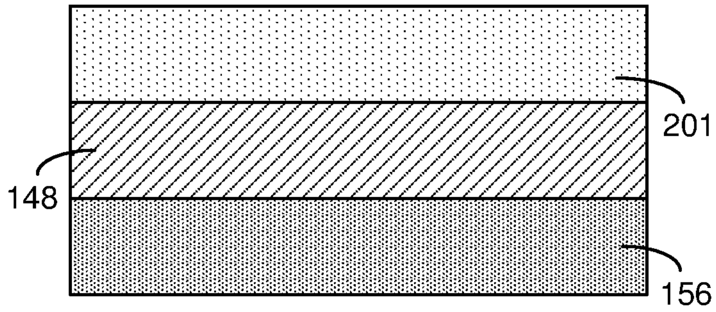
Figure 5C:
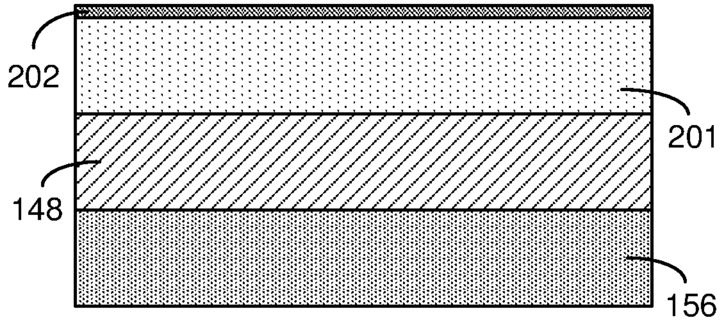
Figure 5D:
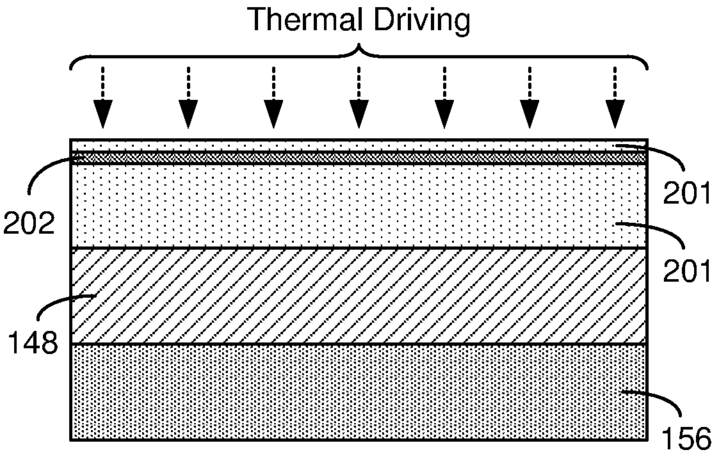
Figure 5E:
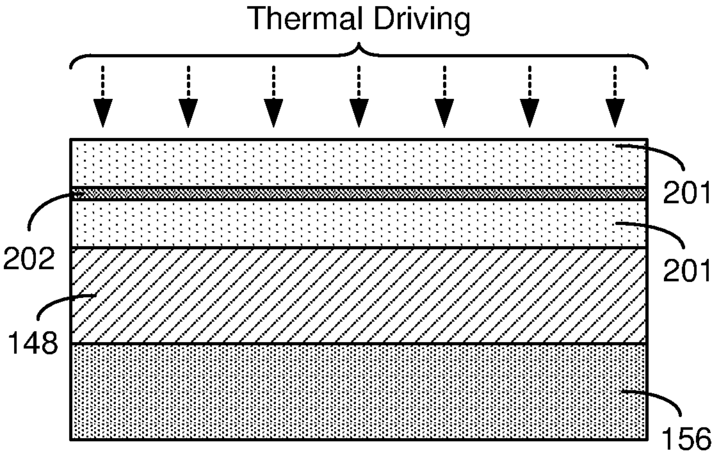
Figure 5F:
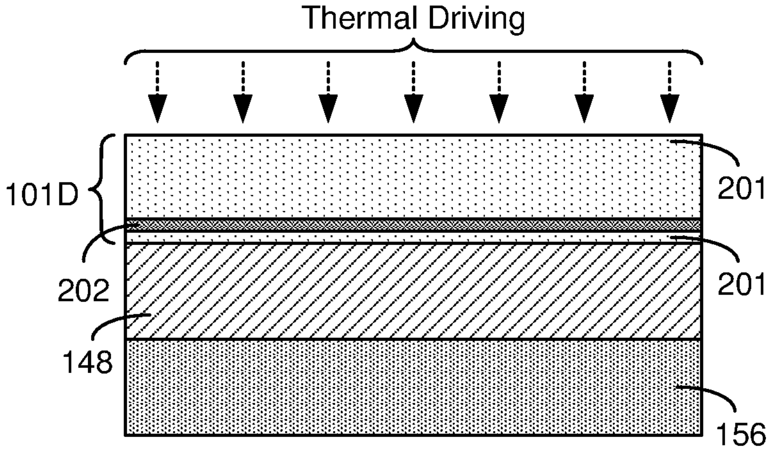
Figure 5G:
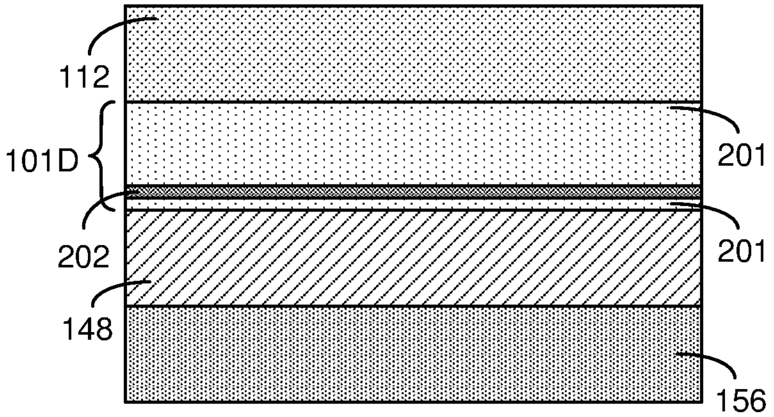
Figure 5H:
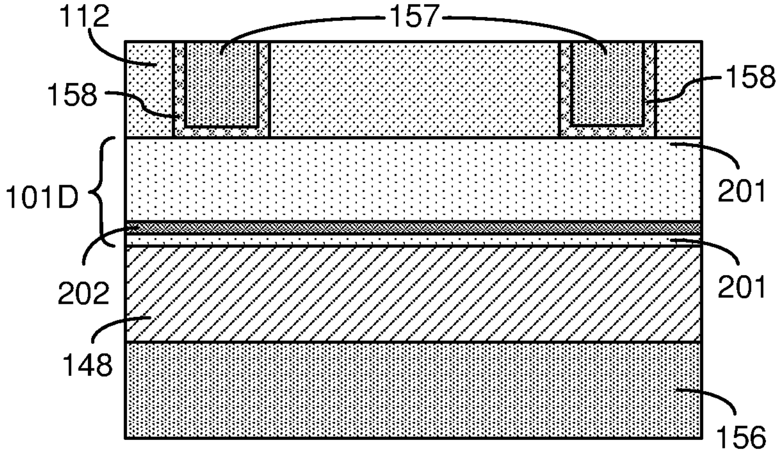

FIGS. 5A through 5H illustrate cross-sectional views of some embodiments of a BEOL back-gate transistor that includes a p-type oxide semiconductor layer 101D, at various stages of manufacture, according to the present disclosure. In some embodiments, the stages depicted in FIGS. 5A, 5G, and 5H are the same as, or similar to, those of FIGS. 2A, 2E, and 2F, respectively, as described above. FIGS. 5B through 5F illustrate the forming (e.g., deposition) of p-type oxide semiconductor layer 101D over gate dielectric layer 148. More specifically, FIG. 3B illustrates a layer of first material 201 that includes a p-type oxide semiconductor material. In some embodiments, the p-type oxide semiconductor material may include at least one of those materials listed above in conjunction with FIG. 2B, and may have a same thickness as described above.

FIG. 5C illustrates the forming (e.g., deposition) of a layer of a second material 202 on the layer of first material 201. In some embodiments, second material 202 may possess a Gibbs free energy that is less than a Gibbs free energy of first material 201, as described above. In some embodiments, second material 202 may include at least one of the same materials discussed above in connection with FIG. 2C, and may have a same thickness as described above.

FIGS. 5D through 5F illustrate the thermal driving (e.g., by way of heating) of the layer of second material 202 (e.g., downward) into an interior of the layer of first material 201. In some embodiments, the thermal driving may be performed by way of heating of a surrounding gaseous environment of first material 201 and/or second material 202, a direct heating (e.g., via light) of first material 201 and/or second material 202, or another heating method. In some embodiments, a final position of the layer of second material 202 within the layer of first material 201 may be controlled by an amount of thermal energy added and/or an amount of elapsed time during which the thermal driving occurs, as shown in FIGS. 5D through 5F. While FIG. 5F depicts a final position of the layer of second material 202 near a lower surface of the layer of first material 201, other positions of the layer of second material 202, such as near an upper surface of the layer of first material 201 (e.g., as depicted in FIG. 5D), or centrally located within the layer of first material 201 (e.g., as illustrated in FIG. 5E) may also be chosen as the final position of the layer of second material 202. Also, while each of FIGS. 5D through 5F depict the layer of second material 202 as maintaining its shape, the layer of second material 202 may become at least slightly diffuse within the layer of first material 201 as a result of the thermal driving in some embodiments.

Figure 6A:
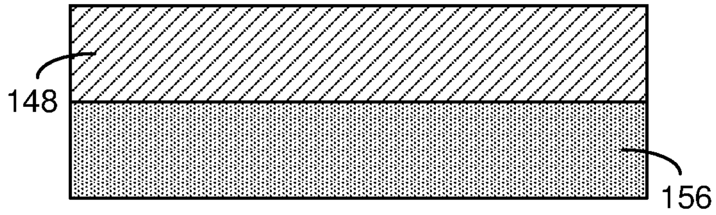
Figure 6B:
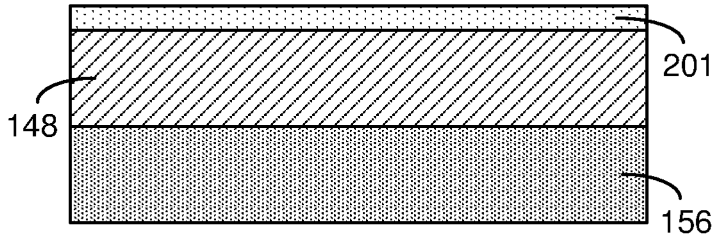
Figure 6C:
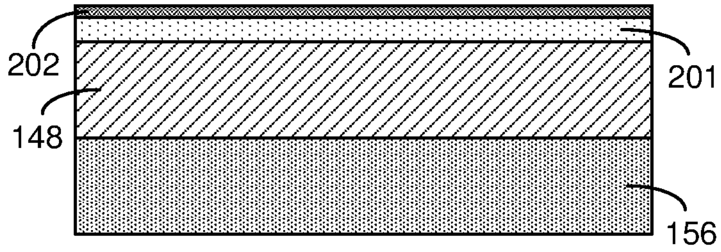
Figure 6D:
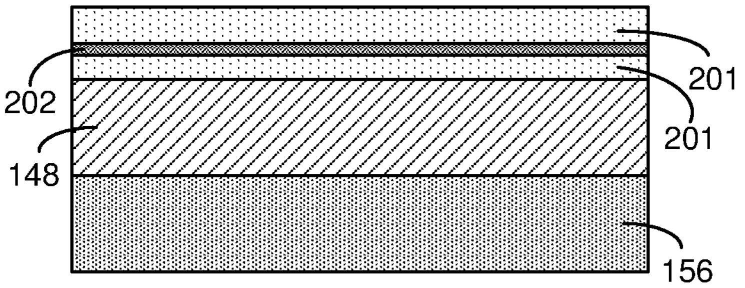
Figure 6E:
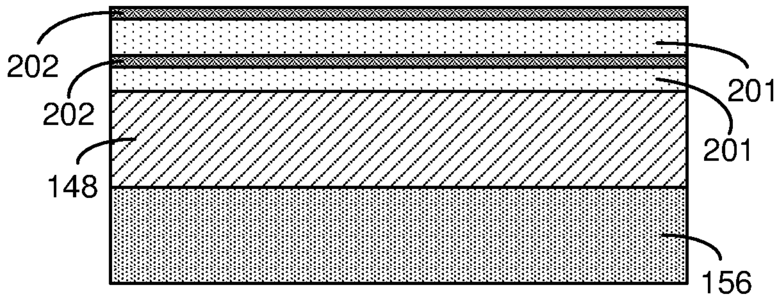
Figure 6F:
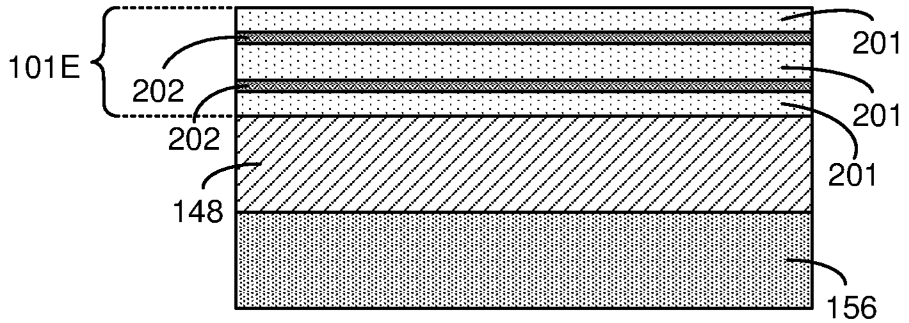
Figure 6G:
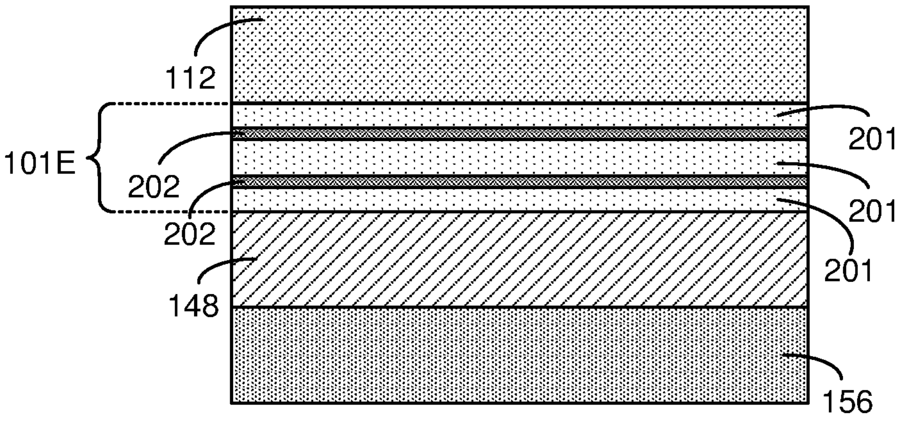
Figure 6H:
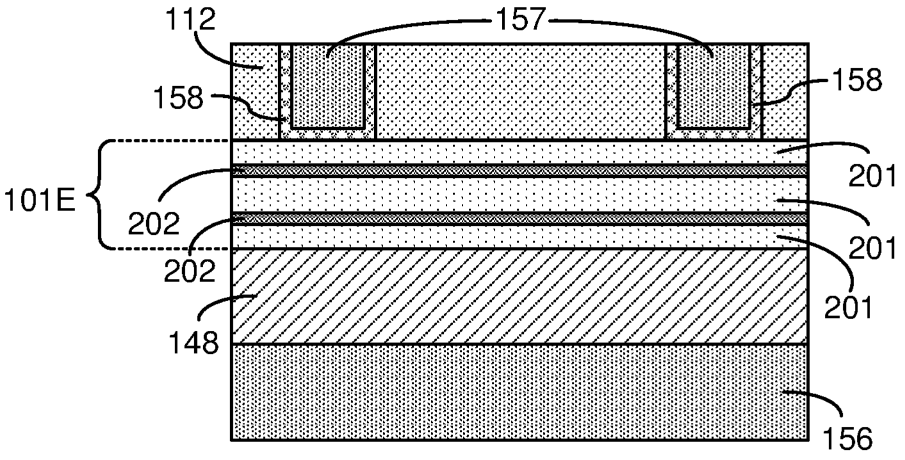

FIGS. 6A through 6H illustrate cross-sectional views of some embodiments of a BEOL back-gate transistor that includes a p-type oxide semiconductor layer 101E, at various stages of manufacture, according to the present disclosure. In some embodiments, the stages depicted in FIGS. 6A, 6G, and 6H are the same as, or similar to, those of FIGS. 2A, 2E, and 2F, respectively, as described above. FIGS. 6B through 6F illustrate the forming (e.g., deposition) of p-type oxide semiconductor layer 101E over gate dielectric layer 148. More specifically, FIG. 6B illustrates a first layer of first material 201 that includes a p-type oxide semiconductor material. In some embodiments, the p-type oxide semiconductor material may include at least one of those materials listed above in conjunction with FIG. 2B, and may have a same thickness as described above.

FIG. 6C illustrates the forming (e.g., deposition) of a first layer of a second material 202 on the first layer of first material 201. In some embodiments, second material 202 may possess a Gibbs free energy that is less than a Gibbs free energy of first material 201, as described above. In some embodiments, second material 202 may include at least one of the same materials discussed above in connection with FIG. 2C, and may have a same thickness as described above.

FIGS. 6D through 6F illustrate the forming (e.g., deposition) of subsequent (e.g., alternating) layers of first material 201 and second material 202 on the first layer of second material 202. More specifically, FIG. 6D illustrates the forming of a second layer of first material 201 on the first layer of second material 202. FIG. 6E illustrates the forming of a second layer of second material 202 on the second layer of first material 201. FIG. 6F illustrates the forming of a third layer of first material 201 on the second layer of second material 202. Consequently, p-type oxide semiconductor layer 101E may include a total of five layers.

In some embodiments, the first and second layers of second material 202 have the same thickness and may be positioned equidistant from a vertical center of the second layer of first material 201. Accordingly, the first and third layers of first material 201 may have the same thickness. In FIG. 6F, the second layer of first material 201 may be thicker than the first and third layers of first material 201. In other embodiments, the second layer of first material 201 may be the same thickness as, or thinner than, the first and third layers of first material 201.

Figure 7A:
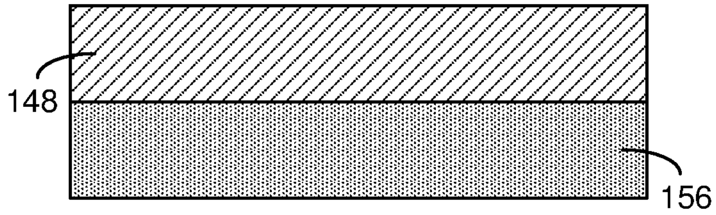
Figure 7B:
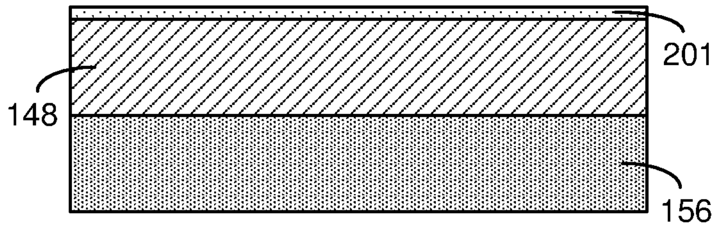
Figure 7C:
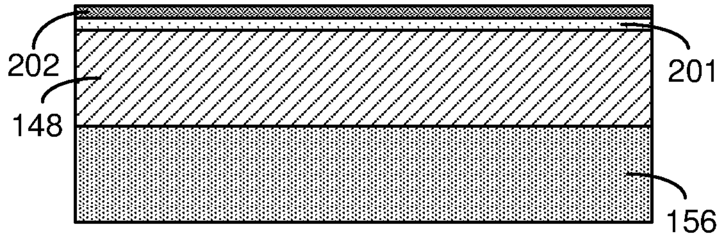
Figure 7D:
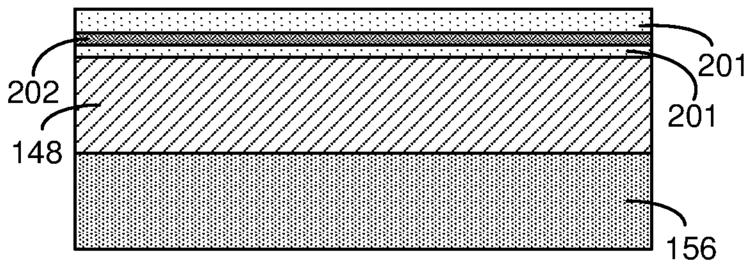
Figure 7E:
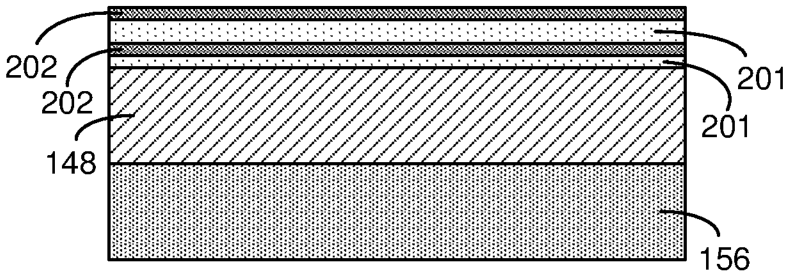
Figure 7F:
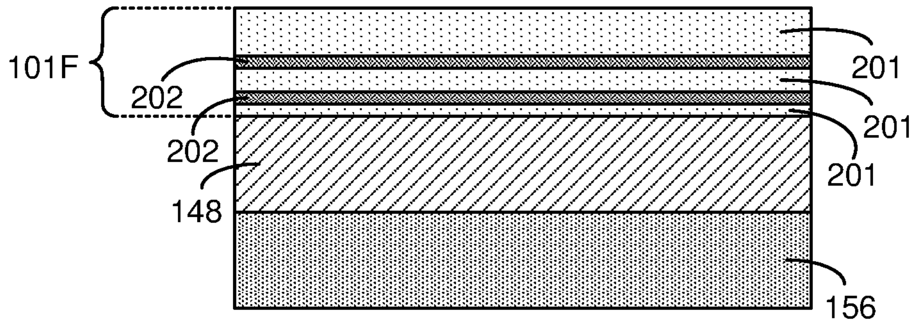
Figure 7G:
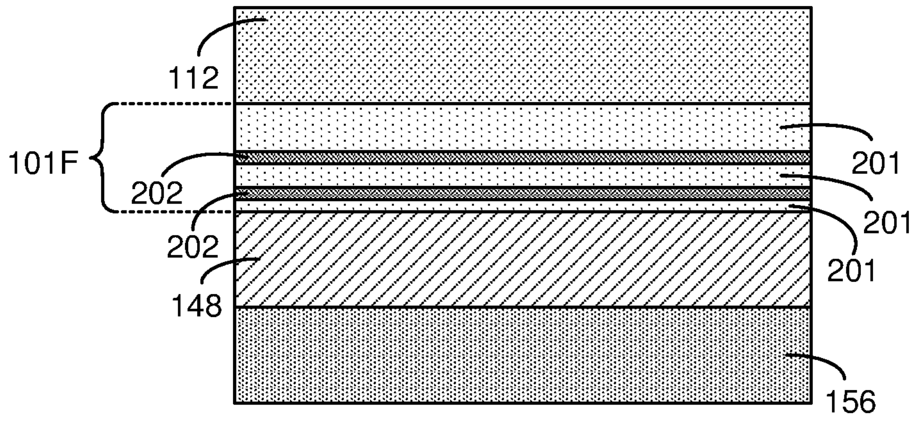
Figure 7H:
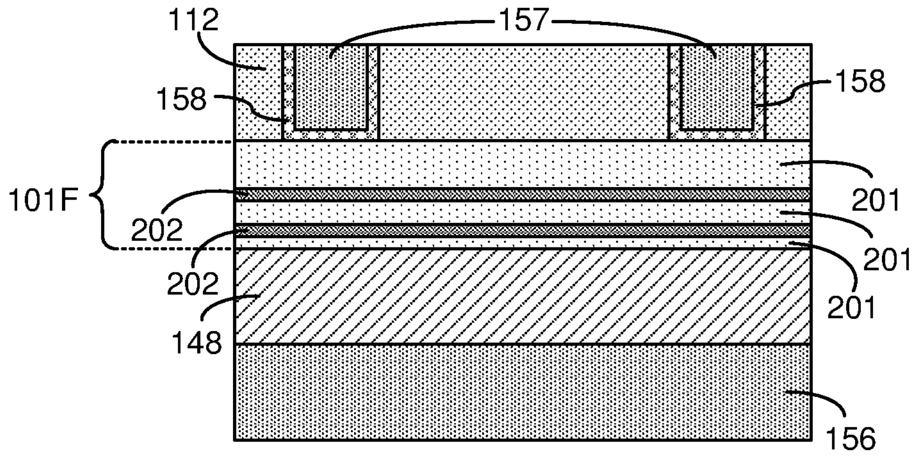

FIGS. 7A through 7H illustrate cross-sectional views of some embodiments of a BEOL back-gate transistor that includes a p-type oxide semiconductor layer 101F, at various stages of manufacture, according to the present disclosure. In some embodiments, the stages depicted in FIGS. 7A, 7G, and 7H are the same as, or similar to, those of FIGS. 6A, 6G, and 6H, respectively, as described above. FIGS. 7B through 7F illustrate the forming (e.g., deposition) of p-type oxide semiconductor layer 101F over gate dielectric layer 148. As was the case with FIGS. 6B through 6F, FIGS. 7B through 7F illustrate the forming of alternating layers of first material 201 and second material 202, as those materials and associated thicknesses are described above, and in which a Gibbs free energy of second material 202 is less than that of first material 201. More specifically, FIGS. 7B, 7C, 7D, 7E, and 7F illustrate, respectively and in order, the forming of a first layer of first material 201, a first layer of second material 202, a second layer of first material 201, a second layer of second material 202, and a third layer of first material 201, resulting in five total layers for p-type oxide semiconductor layer 101F.

In some embodiments, as shown in FIG. 7F, the second layer of second material 202 may be positioned at a vertically centralized location within p-type oxide semiconductor layer 101F. Accordingly, the third layer of first material 201 may be thicker than either of the first or second layers of first material 201. As depicted in FIG. 7D, in some embodiments, the second layer of first material 201 may be thicker than the first layer of first material 201. In other embodiments, the second layer of first material 201 may be the same thickness as, or thinner than, the first layer of first material 201.

Figure 8A:
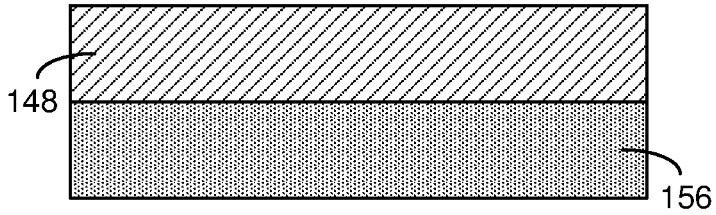
Figure 8B:
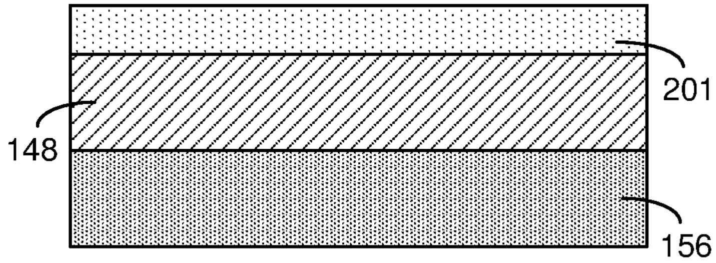
Figure 8C:
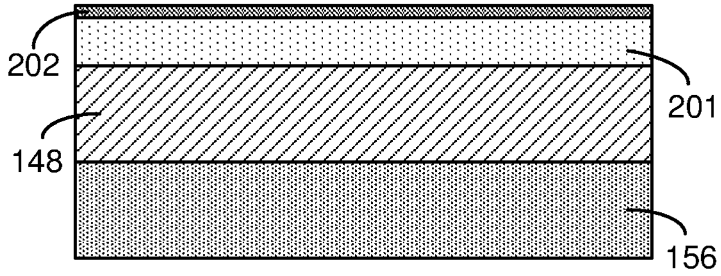
Figure 8D:
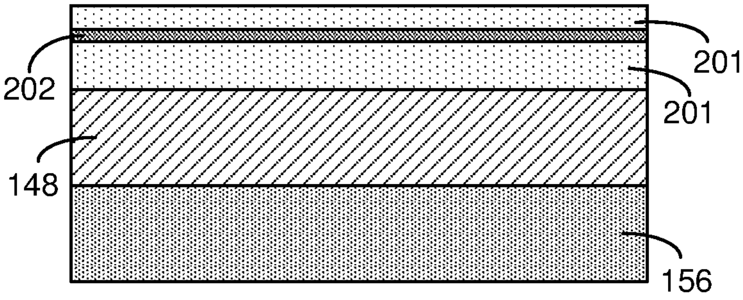
Figure 8E:
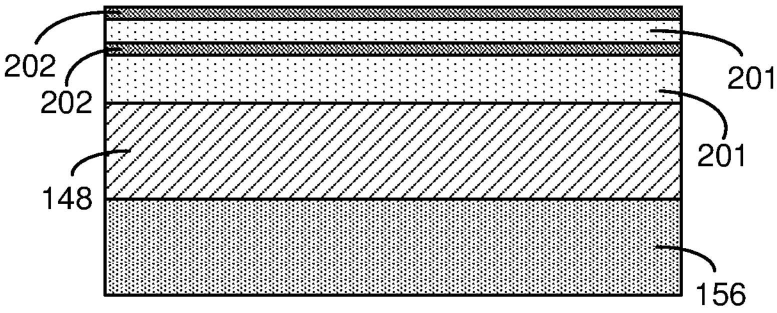
Figure 8F:
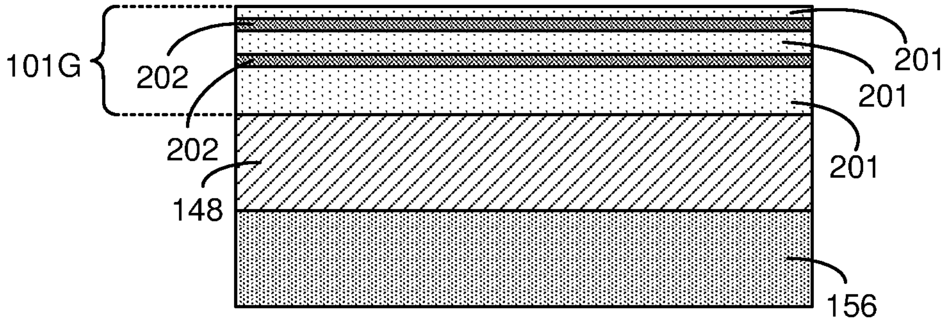
Figure 8G:
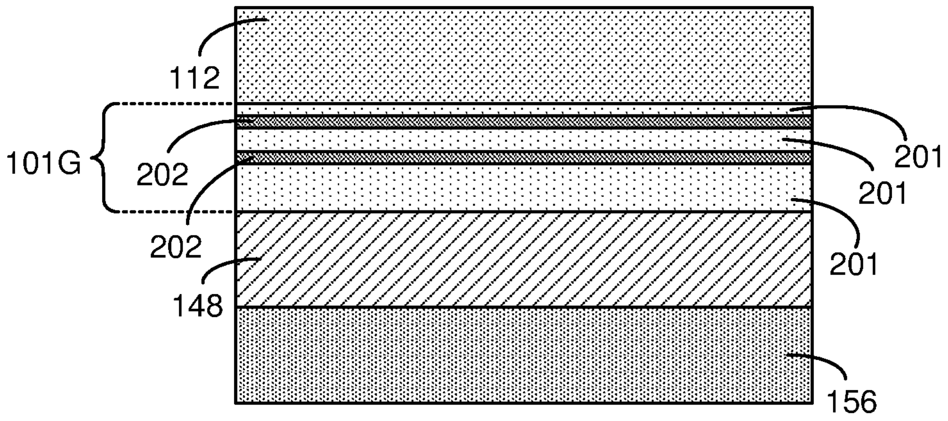
Figure 8H:
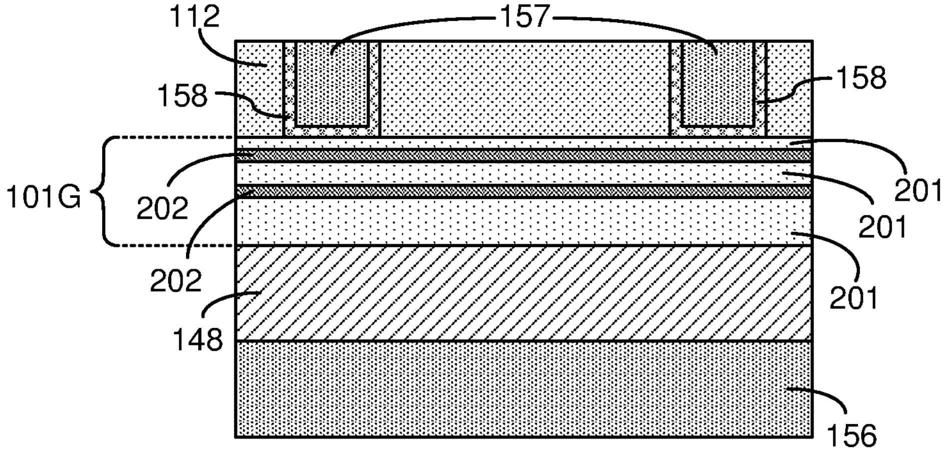

FIGS. 8A through 8H illustrate cross-sectional views of some embodiments of a BEOL back-gate transistor that includes a p-type oxide semiconductor layer 101G, at various stages of manufacture, according to the present disclosure. In some embodiments, the stages depicted in FIGS. 8A, 8G, and 8H are the same as, or similar to, those of FIGS. 6A, 6G, and 6H, respectively, as described above. FIGS. 8B through 8F illustrate the forming (e.g., deposition) of p-type oxide semiconductor layer 101G over gate dielectric layer 148. As was the case with FIGS. 6B through 6F, FIGS. 8B through 8F illustrate the forming of alternating layers of first material 201 and second material 202, as those materials and associated thicknesses are described above, and in which a Gibbs free energy of second material 202 is less than that of first material 201. More specifically, FIGS. 8B, 8C, 8D, 8E, and 8F illustrate, respectively and in order, the forming of a first layer of first material 201, a first layer of second material 202, a second layer of first material 201, a second layer of second material 202, and a third layer of first material 201, resulting in five total layers for p-type oxide semiconductor layer 101G.

In some embodiments, as illustrated in FIG. 8F, the first layer of second material 202 may be positioned at a vertically centralized location within p-type oxide semiconductor layer 101G. Accordingly, the first layer of first material 201 may be thicker than either of the second or third layers of first material 201. As also illustrated in FIG. 8F, in some embodiments, the second layer of first material 201 may be thicker than the third layer of first material 201. In other embodiments, the second layer of first material 201 may be the same thickness as, or thinner than, the third layer of first material 201.

Figure 9A:
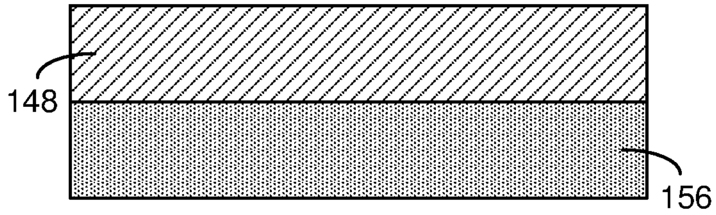
Figure 9B:
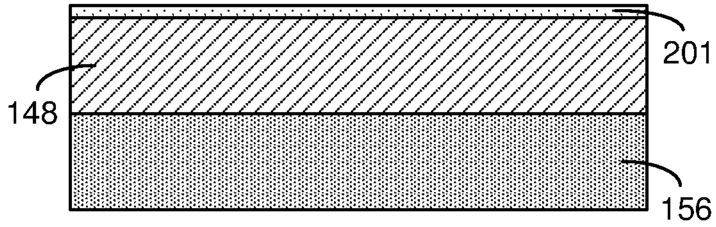
Figure 9C:
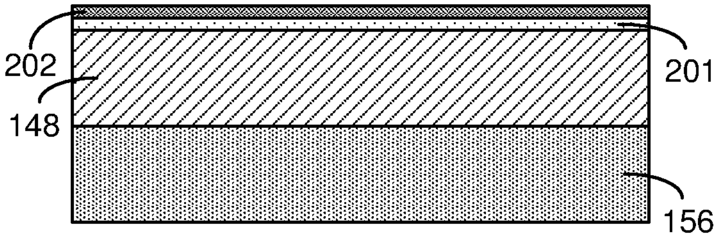
Figure 9D:
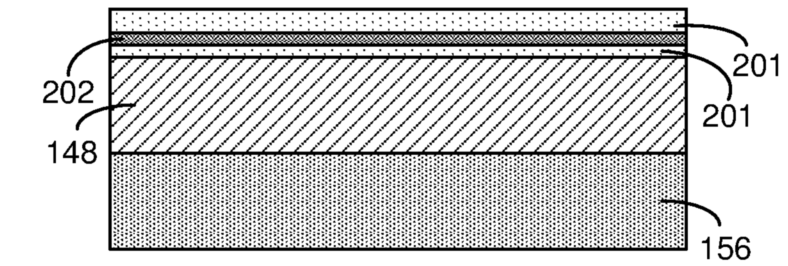
Figure 9E:
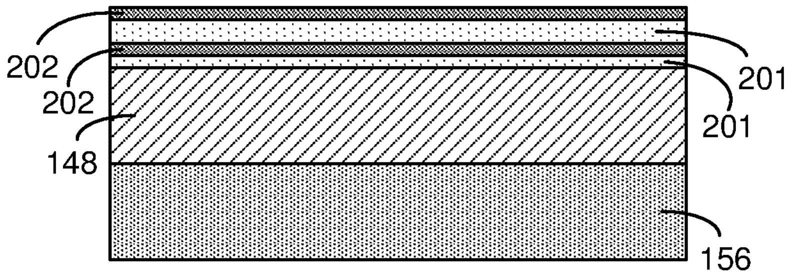
Figure 9F:
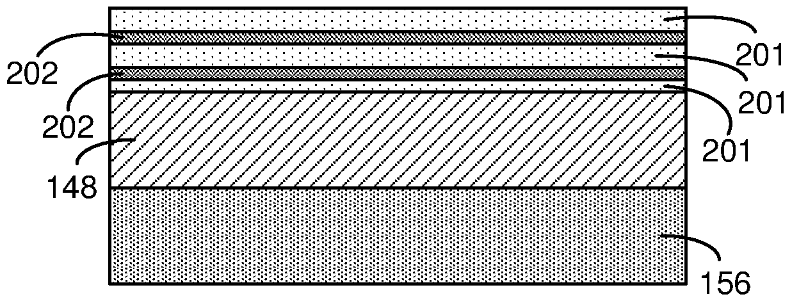
Figure 9G:
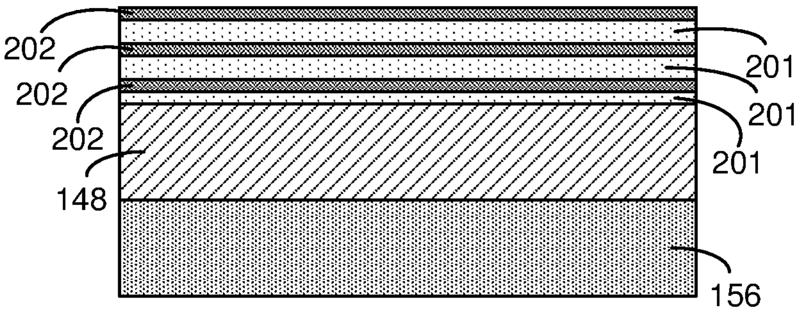
Figure 9H:
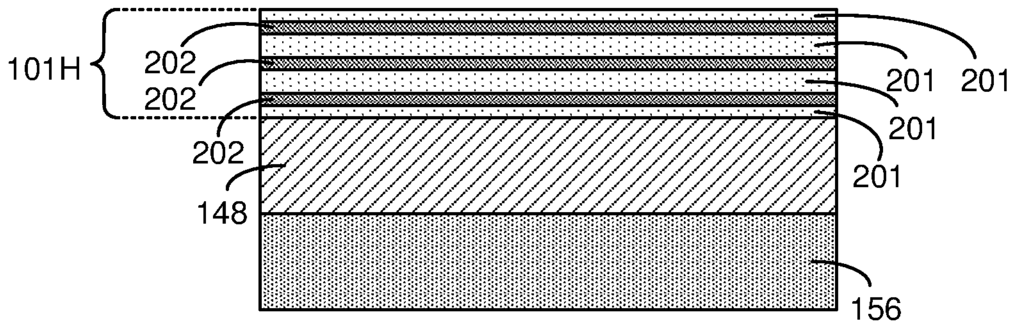
Figure 9I:
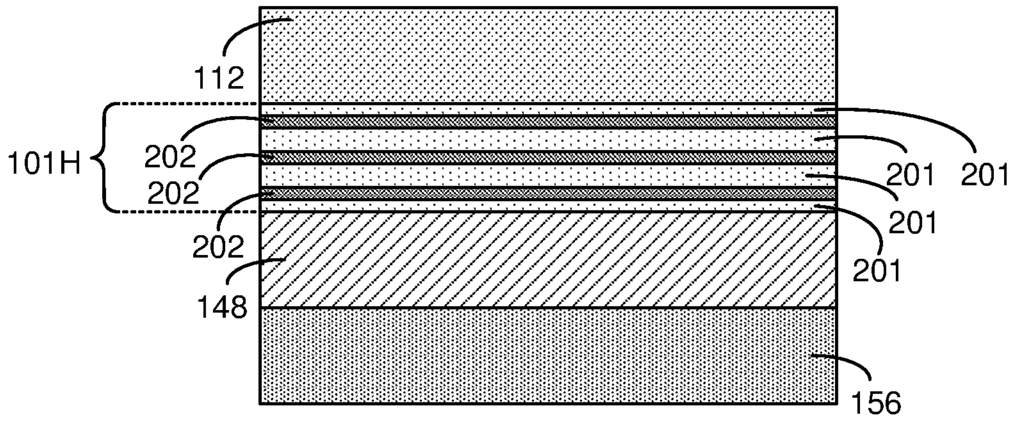
Figure 9J:
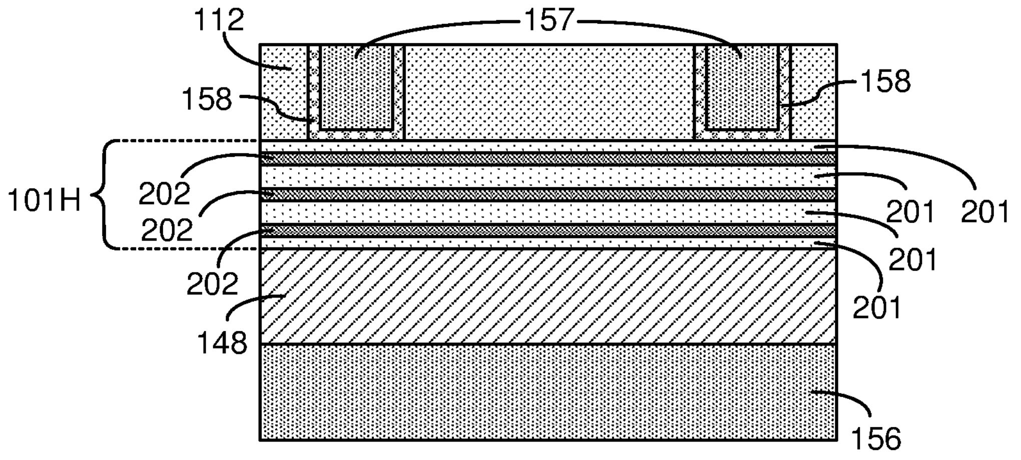

FIGS. 9A through 9J illustrate cross-sectional views of some embodiments of a BEOL back-gate transistor that includes a p-type oxide semiconductor layer 101H, at various stages of manufacture, according to the present disclosure. In some embodiments, the stages depicted in FIGS. 9A, 9I, and 9J are the same as, or similar to, those of FIGS. 6A, 6G, and 6H, respectively, as described above. FIGS. 9B through 9H illustrate the forming (e.g., deposition) of p-type oxide semiconductor layer 101H over gate dielectric layer 148. More specifically, FIGS. 9B through 9H illustrate the forming of alternating layers of first material 201 and second material 202, as those materials and associated thicknesses are described above, and in which a Gibbs free energy of second material 202 is less than that of first material 201. More specifically, FIGS. 9B, 9C, 9D, 9E, 9F, 9G, and 9H illustrate, respectively and in order, the forming of a first layer of first material 201, a first layer of second material 202, a second layer of first material 201, a second layer of second material 202, a third layer of first material 201, a third layer of second material 202, and a fourth layer of first material 201, resulting in seven total layers for p-type oxide semiconductor layer 101H.

In some embodiments, as illustrated in FIG. 9H, the second layer of second material 202 may be positioned at a vertically centralized location within p-type oxide semiconductor layer 101H. Further, in some embodiments, the second and third layers of first material 201 may have a same first thickness, and the first and fourth layers of first material 201 may have a same second thickness. Moreover, in some embodiments, the first thickness may be equal to the second thickness. Other embodiments of p-type oxide semiconductor layer 101H may also display such symmetry across a horizontal plane centrally positioned within p-type oxide semiconductor layer 101H. However, in other embodiments, such symmetry may not be provided, as each of the first, second, third, and fourth layers of first material 201 may be of different thicknesses. Further, while p-type oxide semiconductor layer 101H includes four layers of first material 201, other embodiments may include greater than four (e.g., n) layers of first material 201 with intervening layers (e.g., n−1 layers) of second material 202.

Figure 10A:
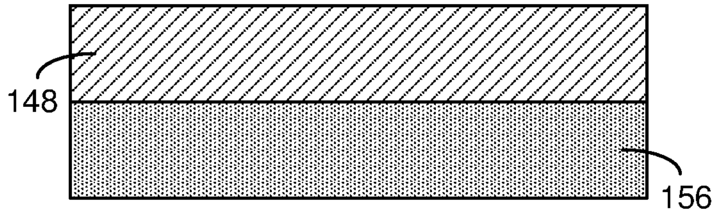
Figure 10B:
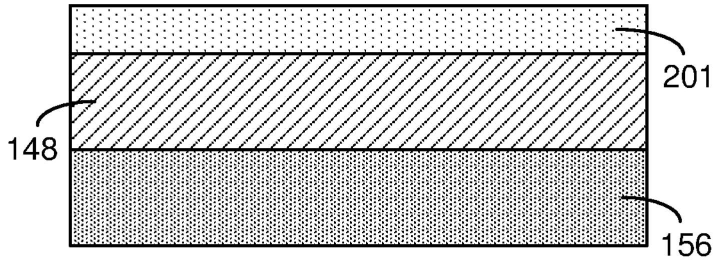
Figure 10C:
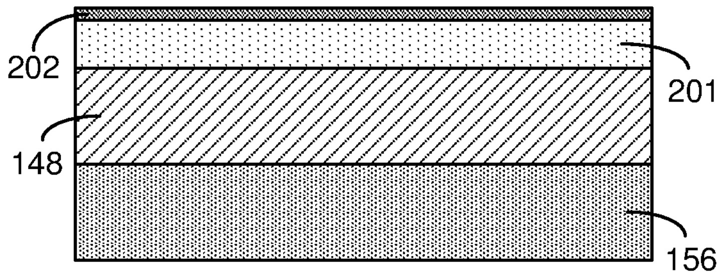
Figure 10D:
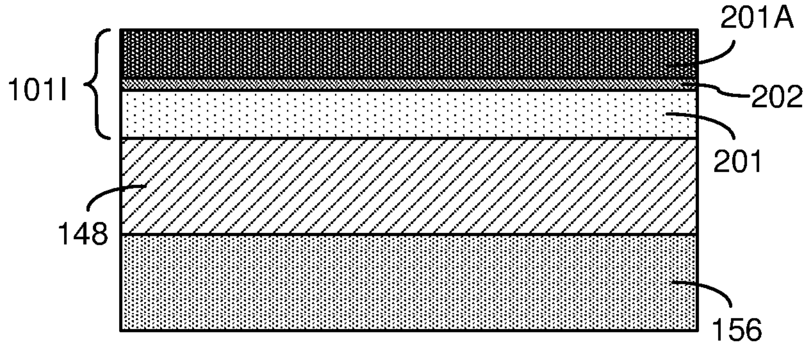
Figure 10E:
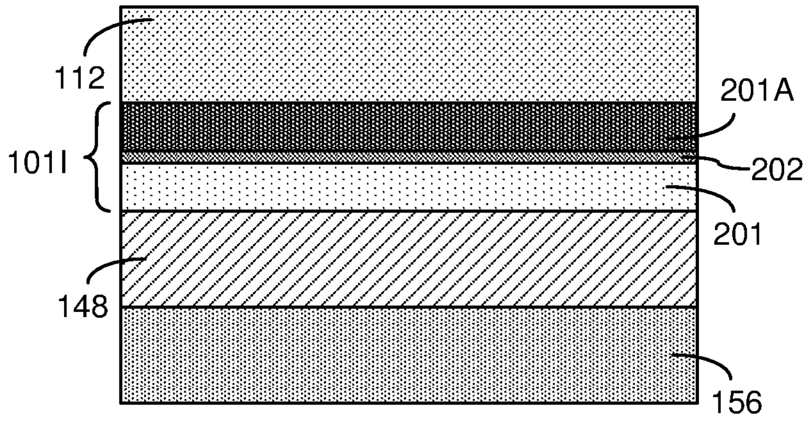
Figure 10F:
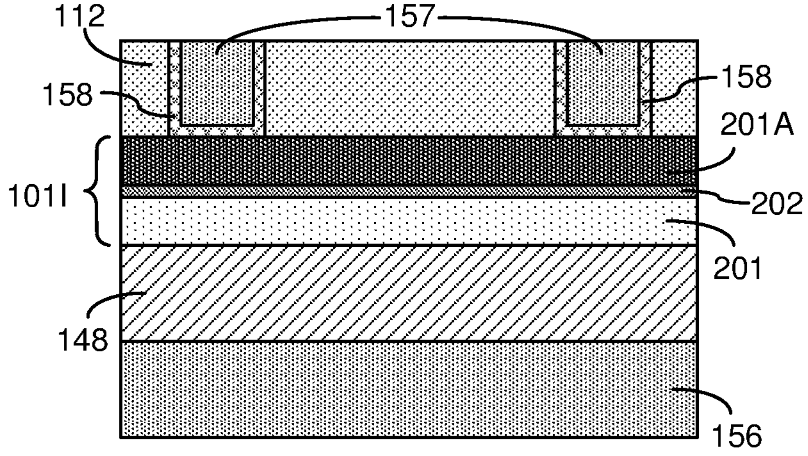

FIGS. 10A through 10F illustrate cross-sectional views of some embodiments of a BEOL back-gate transistor that includes a p-type oxide semiconductor layer 101I, at various stages of manufacture, according to the present disclosure. In some embodiments, the stages depicted in FIGS. 10A, 10E, and 10F are the same as, or similar to, those of FIGS. 2A, 2E, and 2F, respectively, as described above. FIGS. 10B through 10D illustrate the forming (e.g., deposition) of p-type oxide semiconductor layer 101I over gate dielectric layer 148. More specifically, FIG. 10B illustrates a layer of first material 201 that includes a p-type oxide semiconductor material. In some embodiments, the p-type oxide semiconductor material may include at least one of those materials listed above in conjunction with FIG. 2B, and may have a same thickness as described above.

FIG. 10C illustrates the forming (e.g., deposition) of a layer of a second material 202 on the first layer of first material 201. In some embodiments, second material 202 may possess a Gibbs free energy that is less than a Gibbs free energy of first material 201, as described above. In some embodiments, second material 202 may include at least one of the same materials discussed above in connection with FIG. 2C, and may have a same thickness as described above.

FIG. 10D illustrates the forming (e.g., deposition) of a layer of third material 201A on the layer of second material 202, where the third material includes a p-type oxide semiconductor material that is different (e.g., has a different chemical composition) from the p-type oxide semiconductor material of first material 201. In some embodiments, third material 201A may include one or more of the materials listed above in conjunction with first material 201 (e.g., $CuO_x$, $SnO_x$, $TiO_x$, or another oxide semiconductor material). Also, in some embodiments, third material 201A may have a Gibbs free energy that is greater than the Gibbs free energy of second material 202. The Gibbs free energy of third material 201A may be greater than, less than, or equal to the Gibbs free energy of first material 201.

In some embodiments, a thickness of the layer of third material 201A may be as described above with respect to the first layer of first material 201 of FIG. 2B. As depicted in FIG. 10D, the layers of first material 201 and third material 201A may have a same thickness, while in other embodiments, the layer of first material 201 may be thicker or thinner than that of the layer of third material 201A.

While particular embodiments are described above in connection with FIGS. 2A through 10F, aspects of the various embodiments may combined in other ways that are not explicitly described herein. For example, while the embodiments of FIGS. 10A through 10F discuss two layers that include different p-type oxide semiconductor materials, each of the preceding embodiments may be combined with one or more other embodiments discussed above to create embodiments in which more than two separate layers of different p-type oxide semiconductor materials are present. Other combinations of the various embodiments discussed above are also possible.

Figure 11:
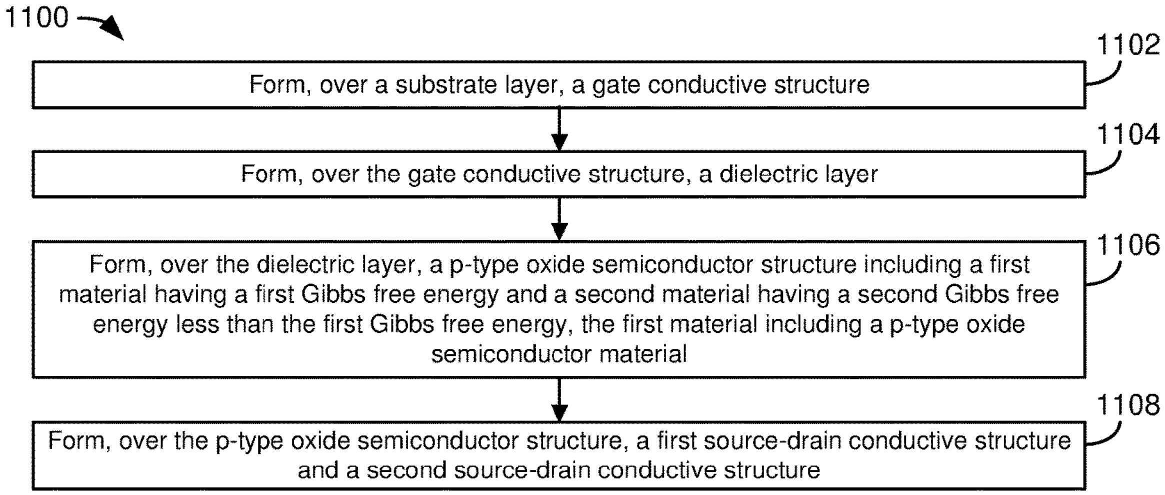
FIG. 11 illustrates a methodology of forming an IC device employing a stabilized p-type oxide semiconductor layer, in accordance with some embodiments.

FIG. 11 illustrates a methodology 1100 of forming an IC device including a stabilized p-type oxide semiconductor layer, in accordance with some embodiments. Although this method and other methods illustrated and/or described herein are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Acts 1102 through 1108 may correspond, for example, to the structures previously illustrated in FIGS. 2A through 2F, FIGS. 3A through 3F, FIGS. 4A through 4F, FIGS. 5A through 5H, FIGS. 6A through 6H, FIGS. 7A through 7H, FIGS. 8A through 8H, FIGS. 9A through 9J, and FIGS. 10A through 10F, in some embodiments, which all correspond with IC device 100A of FIG. 1A. However, methodology 1100 may also be applicable to the same embodiments as applied to IC device 100B of FIGS. 1B and 1C device 100C of FIG. 1C.

At Act 1102, for example, a gate conductive structure (e.g., gate conductive layer 156 of FIGS. 2A, 3A, 4A, 5A, 6A, 7A, 8A, 9A, and 10A) is formed over a substrate layer (e.g., dielectric layer 112 or etch stop layer 115 of FIG. 1A). At Act 1104, a dielectric layer (e.g., gate dielectric layer 148 of FIGS. 2A, 3A, 4A, 5A, 6A, 7A, 8A, 9A, and 10A) is formed over the gate conductive structure. FIGS. 2A, 3A, 4A, 5A, 6A, 7A, 8A, 9A, and 10A illustrate cross-sectional views of some embodiments corresponding to Acts 1102 and 1104.

At Act 1106, a p-type oxide semiconductor structure (e.g., p-type oxide semiconductor layer 101A of FIG. 2D, p-type oxide semiconductor layer 101B of FIG. 3D, p-type oxide semiconductor layer 101C of FIG. 4D, p-type oxide semiconductor layer 101D of FIG. 5F, p-type oxide semiconductor layer 101E of FIG. 6F, p-type oxide semiconductor layer 101F of FIG. 7F, p-type oxide semiconductor layer 101G of FIG. 8F, p-type oxide semiconductor layer 101H of FIG. 9H, and p-type oxide semiconductor layer 101I of FIG. 10D) is formed over the dielectric layer. In some embodiments, the p-type oxide semiconductor structure includes a first material (e.g., first material 201) having a first Gibbs free energy and a second material (e.g., second material 202) having a second Gibbs free energy less than the first Gibbs free energy. The first material may include a p-type oxide semiconductor material. FIGS. 2B through 2D, 3B through 3D, 4B through 4D, 5B through 5F, 6B through 6F, 7B through 7F, 8B through 8F, 9B through 9H, and 10B through 10D illustrate cross-sectional views of some embodiments corresponding to Act 1106. More specific examples of Act 1106 are discussed below in relation to FIGS. 12A through 12C.

At Act 1108, a first source-drain conductive structure and a second source-drain conductive structure (e.g., first and second source-drain conductive structures 157 of FIGS. 2F, 3F, 4F, 5H, 6H, 7H, 8H, 9J, and 10F) are formed over the p-type oxide semiconductor structure. FIGS. 2E and 2F, 3E and 3F, 4E and 4F, 5G and 5H, 6G and 6H, 7G and 7H, 8G and 8H, 9I and 9J, and 10E and 10F illustrate cross-sectional views of some embodiments corresponding to Act 1108.

Figure 12A:
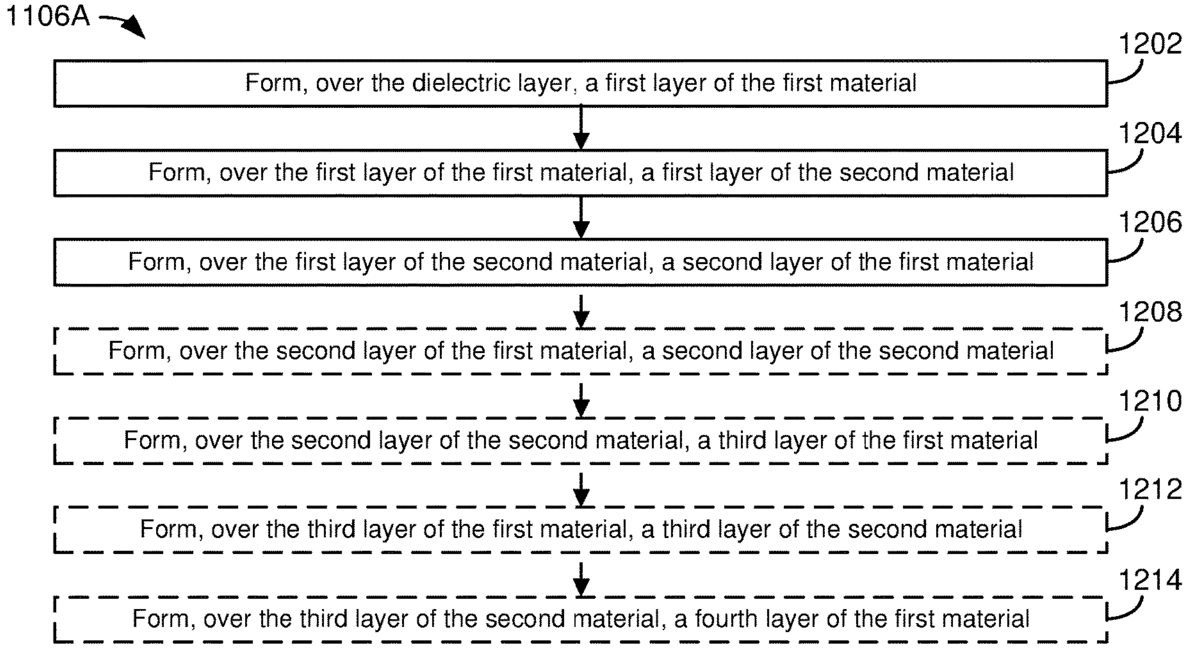
FIGS. 12A through 12C illustrate methodologies of forming a stabilized p-type oxide semiconductor layer, in accordance with some embodiments.
Figure 12B:
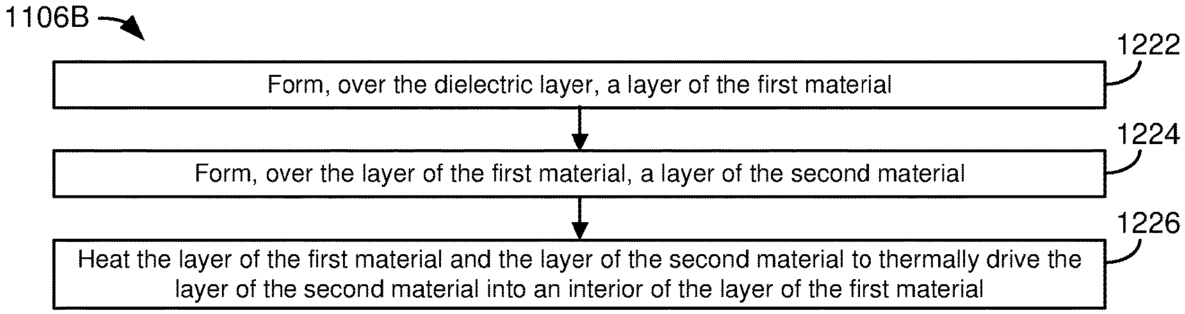
Figure 12C:
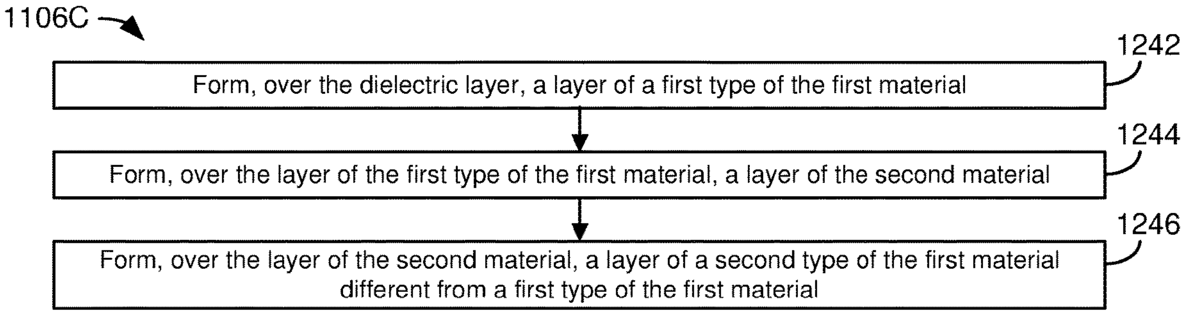

FIGS. 12A through 12C illustrate methodologies 1106A, 1106B, and 1106C, respectively, of forming a stabilized p-type oxide semiconductor layer, in accordance with some embodiments. Each of methodologies 1106A, 1106B, and 1106C may represent embodiments of Act 1106 of methodology 1100 of FIG. 11.

In methodology 1106A of FIG. 12A, at Act 1202, a first layer of the first material (e.g., first material 201) is formed over the dielectric layer (e.g., gate dielectric layer 148). FIGS. 2B, 3B, 4B, 6B, 7B, 8B, and 9B illustrate cross-sectional views of some embodiments corresponding to Act 1202.

At Act 1204, a first layer of the second material (e.g., second material 202) is formed over the first layer of the first material. FIGS. 2C, 3C, 4C, 6C, 7C, 8C, and 9C illustrate cross-sectional views of some embodiments corresponding to Act 1204.

At Act 1206, a second layer of the first material is formed over the first layer of the second material. FIGS. 2D, 3D, 4D, 6D, 7D, 8D, and 9D illustrate cross-sectional views of some embodiments corresponding to Act 1206.

Optionally, at Act 1208, a second layer of the second material is formed over the second layer of the first material. FIGS. 6E, 7E, 8E, and 9E illustrate cross-sectional views of some embodiments corresponding to Act 1208.

Optionally, at Act 1210, a third layer of the first material is formed over the second layer of the second material. FIGS. 6F, 7F, 8F, and 9F illustrate cross-sectional views of some embodiments corresponding to Act 1210.

Optionally, at Act 1212, a third layer of the second material is formed over the third layer of the first material. FIG. 9G illustrates a cross-sectional view of some embodiments corresponding to Act 1212.

Optionally, at Act 1214, a fourth layer of the first material is formed over the third layer of the second material. FIG. 9H illustrates a cross-sectional view of some embodiments corresponding to Act 1214.

In methodology 1106B of FIG. 12B, at Act 1222, a layer of the first material (e.g., first material 201) is formed over the dielectric layer (e.g., gate dielectric layer 148). FIG. 5B illustrates a cross-sectional view of some embodiments corresponding to Act 1222.

At Act 1224, a layer of the second material (e.g., second material 202) is formed over the layer of the first material. FIG. 5C illustrates a cross-sectional view of some embodiments corresponding to Act 1224.

At Act 1226, the layers of the first material and/or the second material are heated to thermally drive the layer of the second material into an interior of the layer of the first material. FIGS. 5D through 5F illustrate cross-sectional views of some embodiments corresponding to Act 1226.

In methodology 1106C of FIG. 12C, at Act 1242, a layer of a first type of the first material (e.g., first material 201) is formed over the dielectric layer (e.g., gate dielectric layer 148). FIG. 10B illustrates a cross-sectional view of some embodiments corresponding to Act 1242.

At Act 1244, a layer of the second material (e.g., second material 202) is formed over the layer of the first type of the first material. FIG. 10C illustrates a cross-sectional view of some embodiments corresponding to Act 1244.

At Act 1246, a layer of a second type of the first material (e.g., third material 201A) different from the first type of the first material is formed over the layer of the second material. FIG. 10D illustrates a cross-sectional view of some embodiments corresponding to Act 1246.

Some embodiments relate to an IC device. The IC device includes a semiconductor layer including a first material having a first Gibbs free energy and a second material having a second Gibbs free energy less than the first Gibbs free energy. The first material includes a p-type oxide semiconductor material. The IC device further includes a dielectric layer contacting a first surface of the semiconductor layer, a gate conductive structure contacting the dielectric layer opposite the semiconductor layer, and a first source-drain conductive structure and a second source-drain conductive structure electrically connected to the semiconductor layer.

Some embodiments relate to another IC device. The IC device includes a gate conductive layer, a dielectric layer disposed over the gate conductive layer, a semiconductor layer disposed over the dielectric layer, and a first source-drain conductive structure and a second source-drain conductive structure disposed over the semiconductor layer. The semiconductor layer includes a plurality of layers of a first material having a first Gibbs free energy and one or more layers of a second material having a second Gibbs free energy less than the first Gibbs free energy. The first material includes a p-type oxide semiconductor material. Each consecutive pair of the plurality of layers of the first material is separated by a corresponding layer of the one or more layers of the second material. A thickness of each of the plurality of layers of the first material is greater than a thickness of each of the one or more layers of the second material.

Some embodiments relate to a method. The method includes: forming, over a substrate layer, a conductive gate structure; forming, over the conductive gate structure, a dielectric layer; and forming, over the dielectric layer, a p-type oxide semiconductor structure forming, over the p-type oxide semiconductor structure, a first source-drain conductive structure and a second source-drain conductive structure. The p-type oxide semiconductor structure includes a first material have a first Gibbs free energy and a second material having a second Gibbs free energy less than the first Gibbs free energy. The first material includes a p-type oxide semiconductor material.

It will be appreciated that in this written description, as well as in the claims below, the terms "first", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:

a semiconductor layer having a first surface and a second surface opposite the first surface, the semiconductor layer comprising:

a first material having a first Gibbs free energy, the first material comprising a p-type oxide semiconductor material, wherein the first surface and the second surface comprise the first material; and a second material having a second Gibbs free energy less than the first Gibbs free energy, wherein the second material is disposed between the first surface and the second surface;

a dielectric layer contacting the first surface of the semiconductor layer;

a gate conductive structure contacting the dielectric layer opposite the semiconductor layer; and a first source-drain conductive structure and a second source-drain conductive structure electrically connected to the semiconductor layer.

2. The IC device of claim 1, wherein:

the semiconductor layer includes at least two layers of the first material; and each consecutive pair of the at least two layers of the first material is separated by a corresponding layer of the second material.

3. The IC device of claim 2, wherein each of the at least two layers of the first material is at least three nanometers thick and less than or equal to 100 nanometers thick.

4. The IC device of claim 2, wherein each corresponding layer of the second material is at least five angstroms thick and less than or equal to 50 angstroms thick.

5. The IC device of claim 1, wherein the semiconductor layer includes:

two layers of the first material; and one layer of the second material disposed between the two layers of the first material.

6. The IC device of claim 5, wherein the two layers of the first material have a same thickness.

7. The IC device of claim 5, wherein a thickness of one of the two layers of the first material is greater than a thickness of another one of the two layers of the first material.

8. The IC device of claim 5, wherein a chemical composition of a first layer of the two layers of the first material is different from a chemical composition of a second layer of the two layers of the first material.

9. The IC device of claim 1, wherein the semiconductor layer includes:

a first layer, a second layer, and a third layer of the first material;

a first layer of the second material disposed between and adjacent to the first layer and the second layer of the first material; and a second layer of the second material disposed between and adjacent to the second layer and the third layer of the first material.

10. The IC device of claim 9, wherein a thickness of the second layer of the first material is greater than a thickness of the first layer of the first material and a thickness of the third layer of the first material.

11. The IC device of claim 9, wherein a thickness of the first layer of the first material is greater than a thickness of the second layer of the first material and a thickness of the third layer of the first material.

12. The IC device of claim 1, wherein the semiconductor layer includes:

a first layer, a second layer, a third layer, and a fourth layer of the first material;

a first layer of the second material disposed between and adjacent to the first layer and the second layer of the first material;

a second layer of the second material disposed between and adjacent to the second layer and the third layer of the first material; and a third layer of the second material disposed between and adjacent to the third layer and the fourth layer of the first material.

13. The IC device of claim 12, wherein the first layer, the second layer, the third layer, and the fourth layer of the first material have substantially a same thickness.

14. The IC device of claim 1, wherein the p-type oxide semiconductor material comprises at least one of a copper oxide (CuOx), a tin oxide (SnOx), or a titanium oxide (TiOx).

15. The IC device of claim 1, wherein the second material comprises at least one of gallium nitride (GaN), an aluminum oxide (AlOx), a tantalum oxide (TaOx), an yttrium oxide (YOx), a scandium oxide (ScOx), or a niobium oxide (NbOx).

16. An integrated circuit (IC) device, comprising:

a gate conductive layer;

a dielectric layer disposed over the gate conductive layer;

a semiconductor layer disposed over the dielectric layer, the semiconductor layer comprising:

a plurality of layers of a first material having a first Gibbs free energy, the first material comprising a p-type oxide semiconductor material; and one or more layers of a second material having a second Gibbs free energy less than the first Gibbs free energy, wherein each consecutive pair of the plurality of layers of the first material is separated by a corresponding layer of the one or more layers of the second material, and wherein a thickness of each of the plurality of layers of the first material is greater than a thickness of each of the one or more layers of the second material; and a first source-drain conductive structure and a second source-drain conductive structure disposed over the semiconductor layer.

17. A method, comprising:

forming, over a substrate layer, a conductive gate structure;

forming, over the conductive gate structure, a dielectric layer;

forming, over the dielectric layer, a p-type oxide semiconductor structure comprising:

a first material having a first Gibbs free energy, the first material comprising a p-type oxide semiconductor material; and a second material having a second Gibbs free energy less than the first Gibbs free energy; and forming, over the p-type oxide semiconductor structure, a first source-drain conductive structure and a second source-drain conductive structure, wherein the first source-drain conductive structure and the second source-drain conductive structure are separated from the second material by the first material.

18. The method of claim 17, wherein forming the p-type oxide semiconductor structure comprises:

forming, over the dielectric layer, a first layer of the first material;

forming, over the first layer of the first material, a layer of the second material; and forming over the layer of the second material, a second layer of the first material.

19. The method of claim 17, wherein forming the p-type oxide semiconductor structure comprises:

forming, over the dielectric layer, a layer of a first type of the first material, the first type of the first material comprising a first type of the p-type oxide semiconductor material;

forming, over the layer of the first type of the first material, a layer of the second material; and forming over the layer of the second material, a layer of a second type of the first material, the second type of the first material comprising a second type of the p-type oxide semiconductor material.

20. The method of claim 17, wherein forming the p-type oxide semiconductor structure comprises:

forming, over the dielectric layer, a layer of the first material;

forming, over the layer of the first material, a layer of the second material; and heating the layer of the first material and the layer of the second material to thermally drive the layer of the second material into an interior of the layer of the first material.

* * * * *